United States Patent
Chen

(10) Patent No.: US 9,780,742 B2
(45) Date of Patent: Oct. 3, 2017

(54) SUPER-EFFICIENT SINGLE-STAGE ISOLATED SWITCHING POWER AMPLIFIER

(71) Applicant: GuangDong Redx Electrical Technology Limited, Dong Guan (CN)

(72) Inventor: Xue Jian Chen, Dong Guan (CN)

(73) Assignee: GuangDong Redx Electrical Technology Limited, Dongguan, Guangdong (CN)

(*) Notice: Subject to any disclaimer, the term of this patent is extended or adjusted under 35 U.S.C. 154(b) by 0 days.

(21) Appl. No.: 15/093,543

(22) Filed: Apr. 7, 2016

(65) Prior Publication Data

US 2016/0226461 A1 Aug. 4, 2016

Related U.S. Application Data

(63) Continuation of application No. 14/093,395, filed on Nov. 29, 2013, now Pat. No. 9,312,823.

(Continued)

(51) Int. Cl.

| | |
|---|---|
| *H03F 3/38* | (2006.01) |
| *H03F 3/217* | (2006.01) |
| *H02M 3/335* | (2006.01) |
| *H02M 1/34* | (2007.01) |
| *H04B 1/04* | (2006.01) |
| *H02M 1/00* | (2006.01) |

(52) U.S. Cl.
CPC ...... *H03F 3/2173* (2013.01); *H02M 3/33576* (2013.01); *H03F 3/2171* (2013.01); *H02M 1/34* (2013.01); *H02M 2001/0003* (2013.01); *H02M 2001/0038* (2013.01); *H02M 2001/342* (2013.01); *H03F 3/217* (2013.01); *H03F 2200/391* (2013.01); *H03F 2200/534* (2013.01); *H03F 2200/66* (2013.01); *H04B 2001/045* (2013.01); *Y02B 70/1491* (2013.01)

(58) Field of Classification Search
CPC ..... H02M 1/34; H04B 2001/045; H03F 3/217
USPC ..... 330/9, 10, 51, 65, 123, 189, 190, 207 A, 330/251; 307/17, 20, 107; 323/282; 327/128, 365, 384, 443; 361/91.7, 189, 361/268
See application file for complete search history.

(56) References Cited

U.S. PATENT DOCUMENTS 4,992,751 A * 2/1991 Attwood .............. H03F 3/38
                                                    330/10
5,963,086 A * 10/1999 Hall .................. H03F 3/217
                                                    330/10

(Continued)

OTHER PUBLICATIONS

Ljusev et al., "Direct-conversion switching-mode audio power amplifier with active capacitive voltage clamp," Power Electronics Specialists Conference, 2005. PESC '05. IEEE 36$^{th}$, pp. 2848-2854.*

*Primary Examiner* — Steven J Mottola
*Assistant Examiner* — Hafizur Rahman
(74) *Attorney, Agent, or Firm* — Jundong Ma

(57) ABSTRACT

A super-efficient single-stage switching power amplifier is realized by not incorporating a rectification process in its power conversion loop while incorporating a bidirectional active clamping circuit to not only remove or maximally reduce otherwise occurring disruptive ringing and spikes but also convert the energy otherwise associated with the ringing and spikes to return energy that goes back to the DC power supply.

14 Claims, 16 Drawing Sheets

Related U.S. Application Data

(60) Provisional application No. 61/730,947, filed on Nov. 28, 2012.

(56) References Cited

U.S. PATENT DOCUMENTS

| | | | | |
|---|---|---|---|---|
| 2008/0252370 A1* | 10/2008 | Mun | ............... | H03F 1/0227 330/9 |
| 2009/0268486 A1* | 10/2009 | Ljusev | ............... | H03F 1/38 363/15 |
| 2010/0182083 A1* | 7/2010 | Maeda | ............... | H03F 1/30 330/251 |

* cited by examiner

SUPER-EFFICIENT SINGLE-STAGE ISOLATED SWITCHING POWER AMPLIFIER

CROSS-REFERENCE TO RELATED APPLICATION

This application is a continuation application under 35 U.S.C. §120 of U.S. Non-provisional patent application Ser. No. 14/093,395, filed on Nov. 29, 2013 and claiming the benefit under 35 U.S.C. §119(e) of U.S. Provisional Application No. 61/730,947, filed on Nov. 28, 2012, the entire disclosures of both aforesaid prior applications being incorporated herein by reference.

BACKGROUND

1. Technical Field

The present disclosure generally relates to a power conversion system, and more particularly, relates to a super-efficient single-stage isolated switching amplifier.

2. Description of the Related Art

A power conversion apparatus functions to convert supplied power from a power source into electrical power for a load. For an ideal power conversion process conducted by a power conversion apparatus, a DC power supply theoretically can convert essentially all supplied energy into useful energy for transmittal to a load. However, such efficiency is not always possible in a real conversion apparatus. To achieve high efficiency, a design objective is to maximally or optimally reduce or eliminate power losses resulting from certain factors in the power flow process.

Power losses incurred in a power conversion apparatus may be viewed from two perspectives, namely, the element perspective and the stage perspective. As to the element perspective, as best shown in FIG. 1, a conventional power apparatus 10 usually contains six elements which can be classified as power-lossy elements, here denoted as switching element P1, transformer element P2, rectifier element P3, amplifier element P4, filtering element P5, and auxiliary power supply element P6.

Switching element P1 usually includes one or more high frequency switches that are used to generate the right power supply needed for power conversation. Transformer element P2 usually includes one or more high-frequency switching isolation transformers. Rectifier element P3 usually includes one or more rectifier circuitries. Amplifier element P4 usually includes a switching-driven amplifier, such as a pulse width modulation (PWM) amplifier, which function to reproduce and amplify an input signal crossing a load. Filtering element P5 usually include one or more circuitries to filter out the high carrier frequency of a PWM amplifier. Auxiliary power supply element P6 usually includes an axillary power supply which in one hand consumes power, and in another hand powers components, such as modulator circuitries, driving circuitries for switching devices, and snubber circuitries absorbing ringing and spikes.

As to the stage perspective, a conventional power conversion apparatus 10, such as a conventional power amplifier 10, usually undergoes at least two stages—namely, the first stage of generating needed power supply (hereinafter referred to as "the supplier stage") and the second stage of applying the generated power supply to amplify an input signal with one or more switching configurations (hereinafter referred to as "the amplifier stage"). At each stage, such a two-stage (or multi-stage) power amplifier 10 incurs power losses, resulting in lowering the system efficiency. Efforts have been made to combine the aforementioned two stages into single stage so as to increase system efficiency. However, such efforts have yielded only very few single-stage power conversion apparatuses 10 in the conventional art.

Regardless of the number of stage or stages, rectifier element P3, which usually includes a rectifier circuit, is usually a necessary element in a conventional power conversion apparatus 10. In the conventional art, even a single-stage power amplifier typically comprises a rectifier circuit in a power conversion process loop. On the other hand, rectifier element P3 consumes power, and is one of the largest power-loss elements among the aforementioned six elements in a conventional power conversion apparatus 10.

For example, consider: (i) a 1000-watt switching power amplifier system 15 in a half-bridge configuration, shown in FIG. 2, (ii) an amplifier element P4 driving a two-ohm load, and (iii) an amplifier stage with efficiency of 90%. In this configuration, rectifier element P3 powering the amplifier stage has an eight-amp RMS current 36 passing through the full-wave rectifier circuit 16. The power loss of each diode in the rectifier circuit 16 is about 5.6 watts, as found using the equation:

$$Ps = \frac{1}{2} \times I \times Vf = 0.5 \times 8A \times 1.4V = 5.6W$$

I is the RMS DC current going through the diodes
Vf is the forward drop of the rectifier diode Accordingly, the total power loss for the four rectifier diodes is about 22.4 watts, or about a 2.24% loss.

Due to the power-lossy nature of rectifier element P3, efforts were expended to eliminate rectifier element P3 in switching power amplifier topologies, particularly in single-stage switching power amplifier topologies, which, as noted above are very few in the conventional art. U.S. Pat. No. 4,479,175 (hereinafter simply referred to as "the '175 patent"), titled "Phase modulated switchmode power amplifier and waveform generator" and issued to Gille et al., describes a single-stage switching power amplifier which deliberately avoids using rectifier element P3. The entire disclosure of the '175 patent is hereby incorporated by reference.

FIG. 3A illustrates such a switching power amplifier described in the '175 patent. Referring to FIG. 3A, amplifier 20 does not incorporate rectifier element P3 in the power flow loop. A first FET S1 and a second FET S2 are configured as a push-pull switching circuit to generate fixed frequency and fixed 50% duty cycle square wave to drive an isolation transformer T1. Ideally, a clean square wave 21, shown in FIG. 3B, should be present across the node A-B in amplifier 20. Power MOSFET pairs (S3, S4) and (S5, S6) act as bidirectional switches 26A and 26B, respectively. In operation, when one bidirectional switch is turned on, the other bidirectional switch is turned off. Both switches switch at the same frequency as the first FET S1 and the second FET S2. Bidirectional switches 26A and 26 are typically controlled by a phase shifted modulator (PSM).

A clock sets driving signals to drive the first FET S1 and the second FET S2. The driving signals of bidirectional switches 26A and 26B may be modulated with an input signal, shifting a phase relative to the clock signal. As the driving signal driving bidirectional switch 26A is phase-shifted by 90° relative to the clock, the corresponding reversed driving signal driving bidirectional switch 26B is phase-shifted by 270° relative to the clock, resulting in zero voltage being produced crossing load 28. As the driving signal of bidirectional switch 26A is phase-shifted by only 1° relative to the clock, the corresponding reversed driving signal driving bidirectional switch 26B is phase-shifted by 181° relative to the clock, resulting in the highest positive voltage crossing load 28.

When bidirectional switch 26A is turned on—which occurs when MOSFETs S3 and S4 as a whole is driven to act as a short circuit—bidirectional switch 26B is turned off, resulting in amplifier 20 having an equivalent circuit shown in FIG. 4A. Referring to FIG. 4B, when bidirectional switch 26B is turned off—which occurs when MOSFETs S5 and S6 are both off—MOSFETs S5 and S6 are equivalent to two capacitors connected in series, resulting in equivalent capacitance of about a few hundred pico-farads. As such, amplifier 20 is seen as an equivalent circuit shown in FIG. 4B. An equivalent circuit similar to the one shown in FIG. 4B is likewise formed when bidirectional switch 26B is turned on and bidirectional switch 26A is turned off.

It can be appreciate that the equivalent circuit of FIG. 4B is very problematic. This is because the leakage inductance of isolation transformer T1 and the aforementioned two equivalent capacitors may resonate, resulting in a large amount of excess ringing and voltage spikes cross Node A-B, as shown in the waveform of Node A-B illustrated in FIG. 4D. The large amount of ringing and spikes can cause undesirable problems. In particular, excessive voltage spikes may overstress the power MOSFETs to break them down, thus rendering amplifier 20 inoperable. Excessive ringing can produce huge EMI signals, which can also be disruptive to amplifier 20.

In the past, efforts have been made to modify amplifier 20 of the '175 patent in an attempt to reduce or the aforementioned large amount of excess ringing and voltage spikes resulting from the design of amplifier 20. For example, as shown in FIG. 5A a snubber network 32 was added to the circuit of amplifier 20 to form a switching power amplifier 30 for the objective of reducing the ringing and spikes. The snubber network 32 is made up of a capacitor C2 and a resistor R1 connected with each other in series, with the capacitance C2 being 2000 pf and the resistance R1 being 20 ohms. The resulting waveform 31 of Node A-B of amplifier 30, as shown in FIG. 5B is much clearer, when compared TO waveform 21 of Node A-B of amplifier 20. However, as clearly seen, waveform 31 still includes large voltage spikes which can be disruptive to amplifier 30 itself. Also, analysis on the power dissipated on the 20-ohm snubber resistor R1 shows that R1 consumes a non-trivial 12.7 watts of power in a 300 W switching power amplifier 30.

In fact, snubber networks, such as snubber network 32, are commonly used in a power conversion system to reduce the ringing and spike energy. However, the use of snubber networks almost always further diminishes the system efficiency, rather than improves it, since a snubber network usually reduces ringing and spikes by first absorbing the energy otherwise associated with ringing and spikes and then dissipating the absorbed energy into one or more its snubber resistors, resulting in the absorbed energy never getting reclaimed for useful (productive) purposes.

Thus, although it is appreciated in the conventional art that avoiding the use of rectifier element P3 in a single-stage switching power conversion apparatus can significantly improve system efficiency of in power conversion process, the conventional art, to Applicant's knowledge, does not have any practical solution which can, in one hand, remove otherwise disruptive "side-effects" (such as large voltage spikes) that usually comes with avoiding the use of rectifier element P3 in a single-stage configuration, and in another hand, increase the system efficiency by reclaiming energy otherwise associated with ringing and spikes for productive uses.

Accordingly, there is a need for a switching power conversion apparatus which avoids or otherwise reduces use of rectifier element P3 without abandoning a single-stage paradigm, while being able to remove or maximally reduce the aforementioned disruptive "side-effects" that usually comes with such an approach, as well as increase system efficiency by reclaiming energy otherwise associated with ringing and spikes for useful purposes.

BRIEF SUMMARY

In one aspect, the present disclosure provides a switching power conversion apparatus that does not incorporate a rectification process in its power conversion loop. In particular, a bidirectional active clamping circuit is incorporated to not only remove or maximally reduce otherwise occurring disruptive ringing and spikes but also convert the energy otherwise associated with the ringing and spikes to return energy that goes back to the DC power supply, thus greatly increasing the system efficiency and achieving an ultra-high system efficiency of up to 97%.

In another aspect, the disclosed bidirectional active clamping circuit is configured to absorb the energy associated with the unwanted ringing and spikes otherwise generated with amplified waveform signals generated at the secondary side of an isolation transformer circuit while manage to substantially maintain the waveforms of the amplified waveform signals, and either return the absorbed energy back to the primary side of the isolation transformer circuit or re-supply the absorbed energy to the secondary side of the isolation transformer circuit and then to a load. In one implementation, the disclosed bidirectional active clamping circuit is configured to, during each cycle of the amplified waveform signals, store energy associated with the unwanted ringing and spikes and discharge the stored energy in such a manner that the discharged energy either returns to the primary side from the secondary side or is re-supplied to the secondary side and then to the load. Thus, using the disclosed bidirectional active clamping circuit, the disclosed switching power conversion apparatus not only manages to remove or maximally reduce otherwise occurring disruptive ringing and spikes but also manages to return energy associated with otherwise occurring disruptive ringing and spikes to the primary side so that the primary side may reclaim and reuse the return energy for productive purposes, such as the power amplification purpose or the purpose of creating soft-switching for switches used to generate switching signals to drive an isolation transformer.

In yet another aspect, the disclosed switching power conversion apparatus comprises a modulator circuit configured to receive an input signal, modulate an input signal, generate carrier signals (modulated with the input signal) and control signals, and supply the generated carrier and control signals to component modules including the disclosed bidirectional power switch circuit. In particular, the control signals supplied to the disclosed bidirectional power switch circuit are so configured that the control signals, during each cycle of the amplified waveform signals, enable the disclosed bidirectional power switch circuit to store energy associated with the unwanted ringing and spikes and discharge the stored energy back to the primary side from the secondary side. With this configuration, modulator circuit 105 manages to be the single control module controlling both the primary side and second side of the transformer circuit to realize converting the input signal to the amplified output signal, and thus enable the disclosed switching power amplifier 100 to achieve conversion from DC power to AC power in a single stage. This serves to enable amplifier 100 to achieve high system efficiency as a single-stage power amplifier.

DETAILED DESCRIPTION OF THE PRESENT DISCLOSURE

Figure 1:
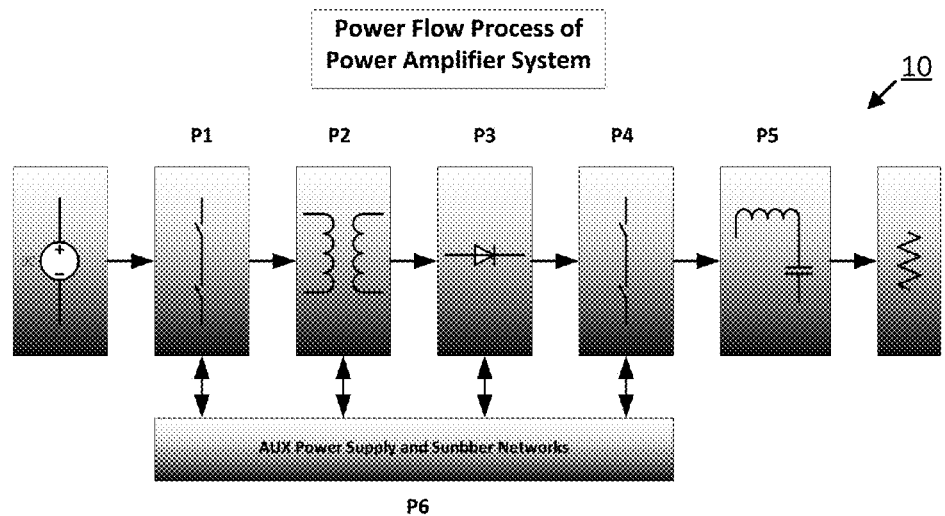
FIG. 1 is a diagrammatical illustration of a power flow of a power amplifier system, in accordance with the related art.
Figure 2:
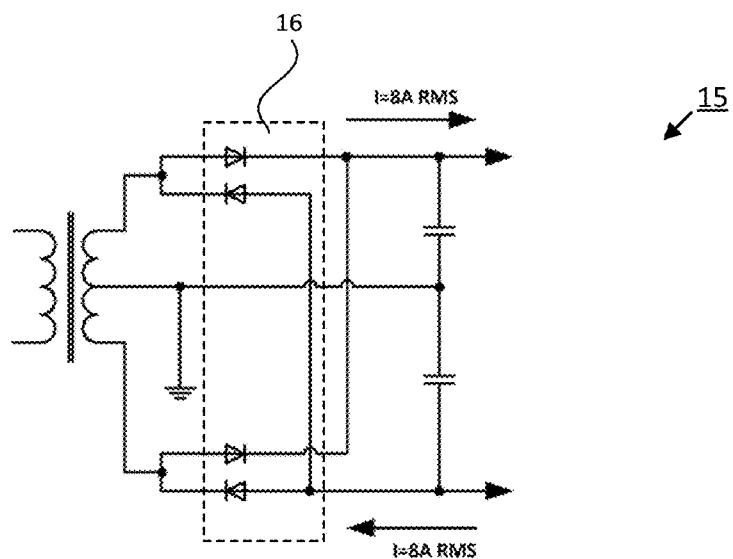
FIG. 2 is a schematic detail of a rectifier element in half-bridge amplifier configuration for illustration the power-lossy nature of a rectifier element, in accordance with the related art.
Figure 3A:
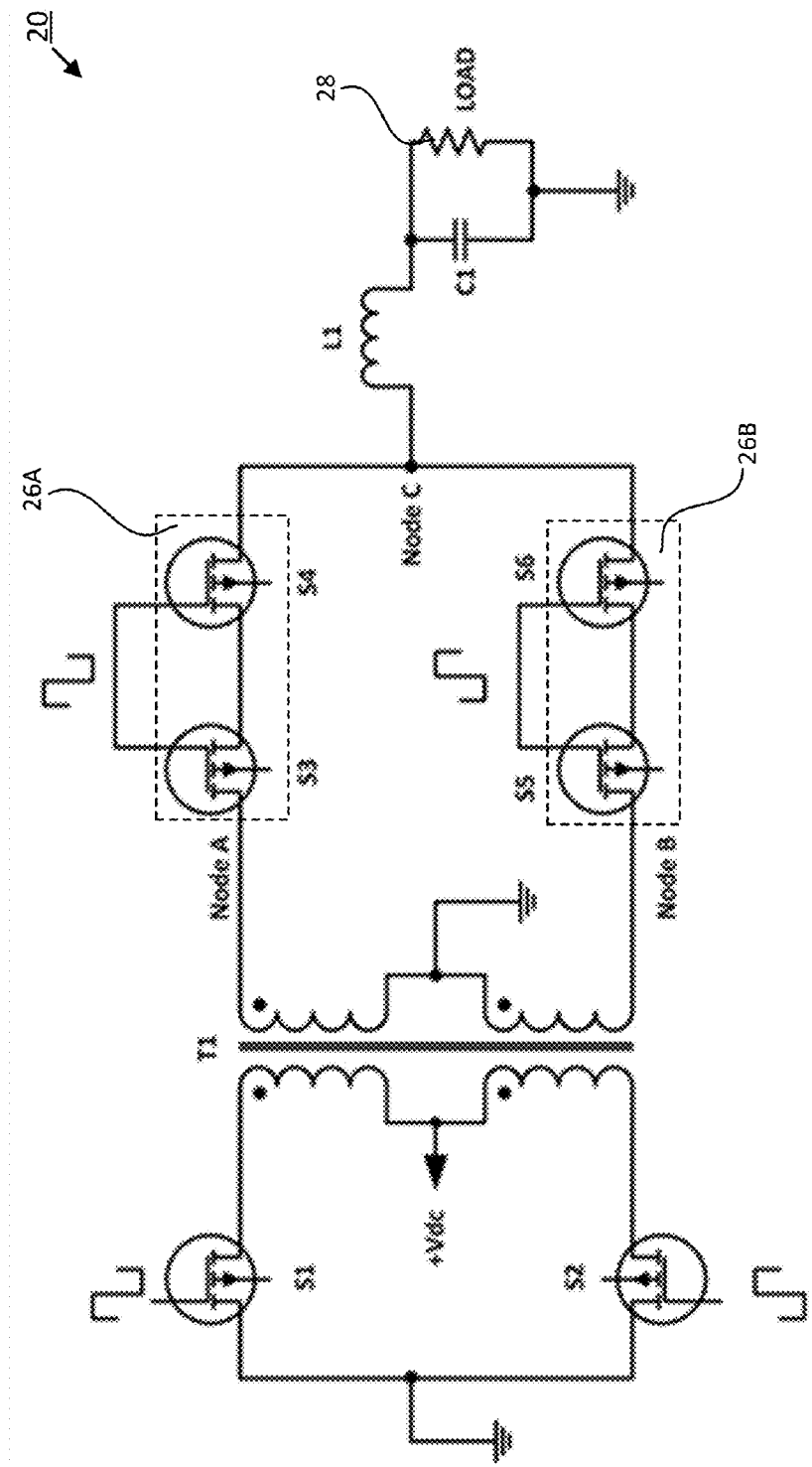
FIGS. 3A-B are a schematic and a pictorial for illustrating a conventional amplifier 20 which avoids the use of a rectifier element in a power flow loop, in accordance with the related art.
Figure 3B:
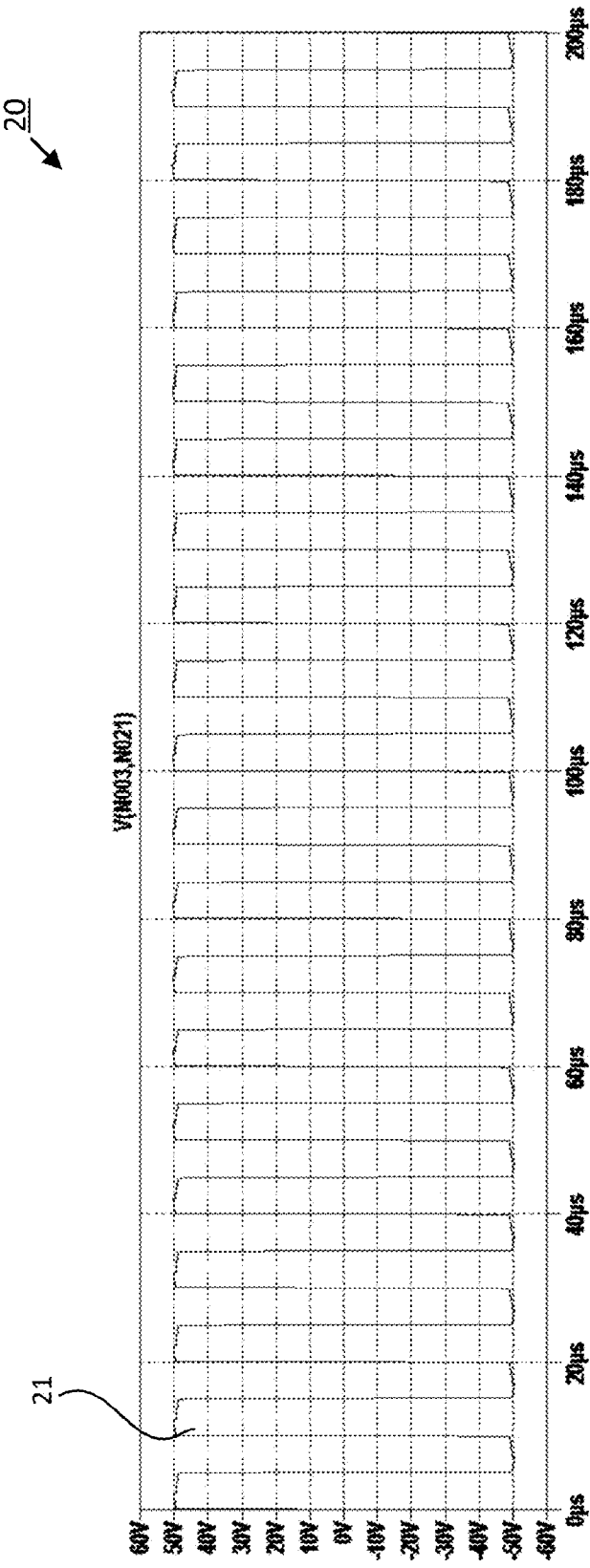

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. Moreover, the use of the terms first, second, etc. do not denote any order or importance, but rather the terms first, second, etc. are used to distinguish one element from another.

Those of ordinary skill in the art will appreciate that the circuit components and basic configuration depicted in the following figures may vary. Other circuit components may be used in addition to or in place of the components depicted. The depicted example is not meant to imply architectural or other limitations with respect to the presently described one or more embodiments and/or the general disclosure.

Within the descriptions of the different views of the figures, the use of the same reference numerals and/or symbols in different drawings indicates similar or identical items, and similar elements can be provided similar names and reference numerals throughout the figure(s). If a reference numeral is once used to refer to a plurality of like elements, unless required otherwise by context, the reference numeral may refer to any, a subset of, or all of, the like elements in the figures bearing that reference numeral. The specific identifiers/names and reference numerals assigned to the elements are provided solely to aid in the description and are not meant to imply any limitations (structural or functional or otherwise) on the described embodiments.

In the description, relative terms such as "left," "right," "vertical," "horizontal," "upper," "lower," "top" and "bottom" as well as any derivatives thereof (e.g., "left side," "upper sub winding," etc.) should be construed to refer to the logical orientation as then described or as shown in the drawing figure under discussion. These relative terms are for convenience of description and are not intended to convey any limitation with regard to a particular orientation.

As used herein, the terms "amplify", "amplification", "amplifying" and "amplified", in the context of signal amplification as applicable to the present disclosure, refer to and encompass both amplification and de-amplification of a signal level of a source input signal in either the same polarity or the opposite polarity of the source input signal. Similarly, as used herein, the term "gain", in the context of amplification of a signal, refers to both gain and attenuation.

As used herein, the terms "signal level", "input level" and other similar terms, in the context of signal modulation or amplification, unless otherwise specified with respect to a particular measurement characteristic, refer to any of voltage level, current level, power level and any combination thereof, as applicable.

For the ease of discussion, a reference numeral referring to a node or device (such as a transformer) may also be used to refer to the signal at the node or the signal drives the device, when the term "signal" precedes the reference numeral. For example, the signal at node A may be referred to as signal A, the signal driving transformer T1 may be referred to as drive signal T1, and the differential signal across nodes A and B may be referred to as signal A-B.

For the ease of discussion, a reference numeral referring to an electrical component, such as an inductor, a capacitor, or a resistor, may also be used to refer to the value of the applicable innate property of the electrical component. For example, L1, which may be used to refer to an inductor, may also be used to refer to the inductance of the inductor. C2, which may be used to refer to a capacitor, may also be used to refer to the capacitance of the capacitor.

Figure 6:
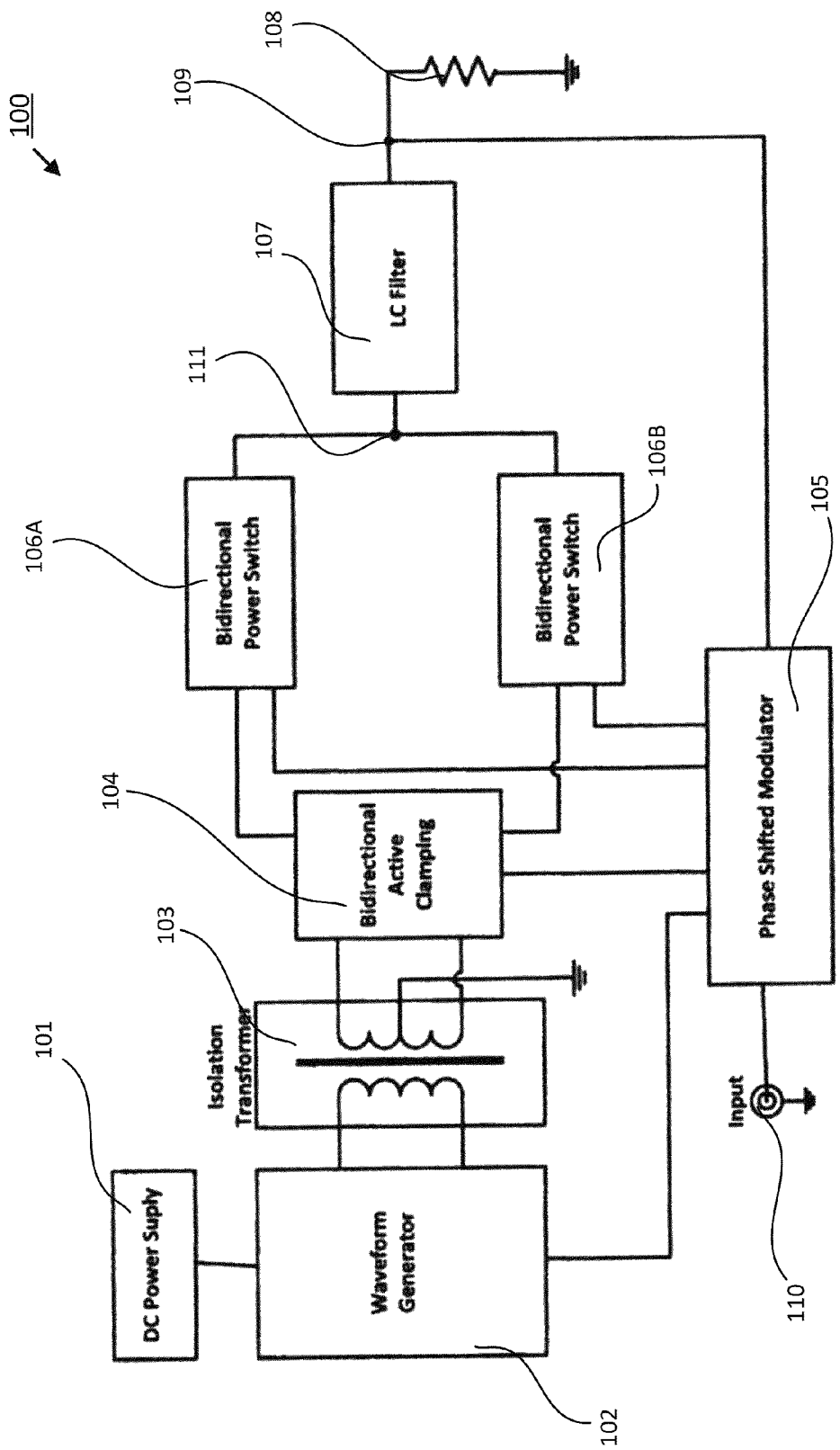
FIG. 6 is simplified functional block diagram illustrating a disclosed single-stage switching power conversion apparatus 100, in accordance with one or more embodiments of the present disclosure.

With reference now to the figures, and beginning with FIG. 6, there is illustrated a functional block diagram illustrating a single-stage switching power conversion apparatus 100, in accordance with one or more embodiments of the present disclosure. Throughout this disclosure, the disclosed single-stage switching power conversion apparatus 100 may also be referred to as single-stage switching power amplifier 100, with the understanding that the disclosed novel and inventive subject matter included or otherwise used in the disclosed single-stage switching power conversion apparatus 100 is not limited to being included or otherwise used in a switching power amplifier, and may be included or otherwise used in other types of apparatus involving a power conversion process. As used herein, the terms "circuit" and "module" may be used interchangeably to refer to a functional module involving electronic circuitries.

Single-stage switching power amplifier 100 may comprise DC power supply circuit 101, waveform generator circuit 102, isolation transformer circuit 103, bidirectional active clamping circuit 104, modulator circuit 105, bidirectional power switch circuit 106, and filter circuit 107.

DC power supply circuit 101 is configured to supply power needed to amplify an input signal 110. DC power supply circuit 101 is also configured to store and recirculate any return energy flowing back from one or more component modules of the disclosed amplifier 100, such as waveform generator circuit 102.

Waveform generator circuit 102 is configured to receive power from DC power supply circuit 101 and generate high-frequency switching signals of specific waveforms (hereinafter simply referred to as "waveform signal(s)") that can drive isolation transformer circuit 103 so as to produce corresponding high-frequency amplified signals that can be used to amplify input signal 110 to generate amplified output signal 109 (across load 108) which is substantially an amplified replica of input signal 110. In one implementation, the high-frequency waveform signals usually have an amplitude (such as voltage amplitude) corresponding to the level (such as voltage level) of the power received from DC power supply circuit 101.

Isolation transformer circuit 103 usually comprises one or more isolation transformers, and has a primary side and a secondary side as defined by its primary and secondary winding(s) of its one or more isolation transformers. Isolation transformer circuit 103 is configured to receive, on the primary side, high-frequency waveform signals from waveform generator circuit 102 and amplify, on the secondary side, the received waveform signals so as to produce corresponding high-frequency amplified signals of corresponding waveforms (hereinafter simply referred to as "amplified waveform signal(s)") that can be used to amplify input signal 110 to produce amplified output signal 109. In one implementation, the produced amplified waveform signals have amplitude levels corresponding to the amplitude level of amplified output signal 109.

Bidirectional active clamping circuit 104 is coupled to the secondary side of transformer circuit 103, and configured to absorb the energy associated with the unwanted ringing and spikes otherwise generated with the amplified waveform signals by isolation transformer circuit 103 while manage to substantially maintain the waveforms of the amplified waveform signals, and return the absorbed energy back to the primary side of isolation transformer circuit 103 and/or supply the absorbed (stored) energy to the secondary side and then to load 108. In one implementation, bidirectional active clamping circuit 104 is configured to, during each cycle of the amplified waveform signals, store (absorb) energy associated with the unwanted ringing and spikes and discharge the stored energy in such a manner that the discharged energy returns to the primary side of isolation transformer circuit 103 from the secondary side of isolation transformer circuit 103 or re-supply the stored energy to the secondary side and then to load 108.

Bidirectional power switch circuit 106 is configured to receive amplified waveform signals from bidirectional active clamping circuit 104 as well as carrier signals modulated with input signal 110, and generate and supply an amplified modulated signal 111 to filter circuit 107 (either at one output node thereof or across two output nodes thereof) using the received amplified waveform signals and carrier signals. In one implementation, bidirectional power switch circuit 106 comprises bidirectional power switch sub-circuits 106A and 106B both coupled to bidirectional active clamping circuit 104 and coupled to filter circuit 107 (via either a single common output node or two output nodes each with respect to a different bidirectional power switch sub-circuit).

Filter circuit 107 is configured to receive amplified modulated signal 111 from bidirectional power switch circuit 106, demodulate signal 111, and generate amplified output signal 109 across load 108. In one implementation, filter circuit 107 may be implemented using a conventional LC filter circuitry. In another implementation, filter circuit 107 may be implemented using another demodulation scheme corresponding to the modulation scheme used to generate amplified modulated signal 111. Although load 108 is exemplified as a resistive load, load 108 can be an inductive load as well.

Modulator circuit 105 is configured to receive input signal 110, modulate input signal 110, generate carrier signals (modulated with input signal 110) and control (drive) signals, and supply the generated carrier and control signals to component modules including waveform generator circuit 102, bidirectional active clamping circuit 104 and bidirectional power switch circuit 106.

Specifically, modulator circuit 105 may supply control (drive) signals to waveform generator circuit 102 so as to control waveform generator circuit 102 to generate high-frequency waveform signals. Further, modulator circuit 105 may supply control signals to bidirectional active clamping circuit 104 so as to control bidirectional active clamping circuit 104 to absorb excessive energy while still manage to substantially maintain the waveforms of the amplified waveform signals, and return the absorbed energy back to the primary side of isolation transformer circuit 103. Still further, modulator circuit 105 may supply carrier signals to bidirectional power switch circuit 106 so as to enable bidirectional power switch circuit 106 to produce amplified modulated signal 111.

As such, modulator circuit 105 is the single control module controlling both the primary side and the secondary side of transformer circuit 103 to realize converting input signal 111 to amplified output signal 109, and thus enable the disclosed switching power amplifier 100 to achieve conversion from DC power to AC power in a single stage. This serves to enable amplifier 100 to achieve high system efficiency as a single-stage power amplifier. In one implementation, modulator circuit 105 uses phase shift modulation (PSM) to modulate input signal 110. In another implementation, modulator circuit 105 may use a modulation scheme other than PSM to modulate input signal 110.

Figure 7:
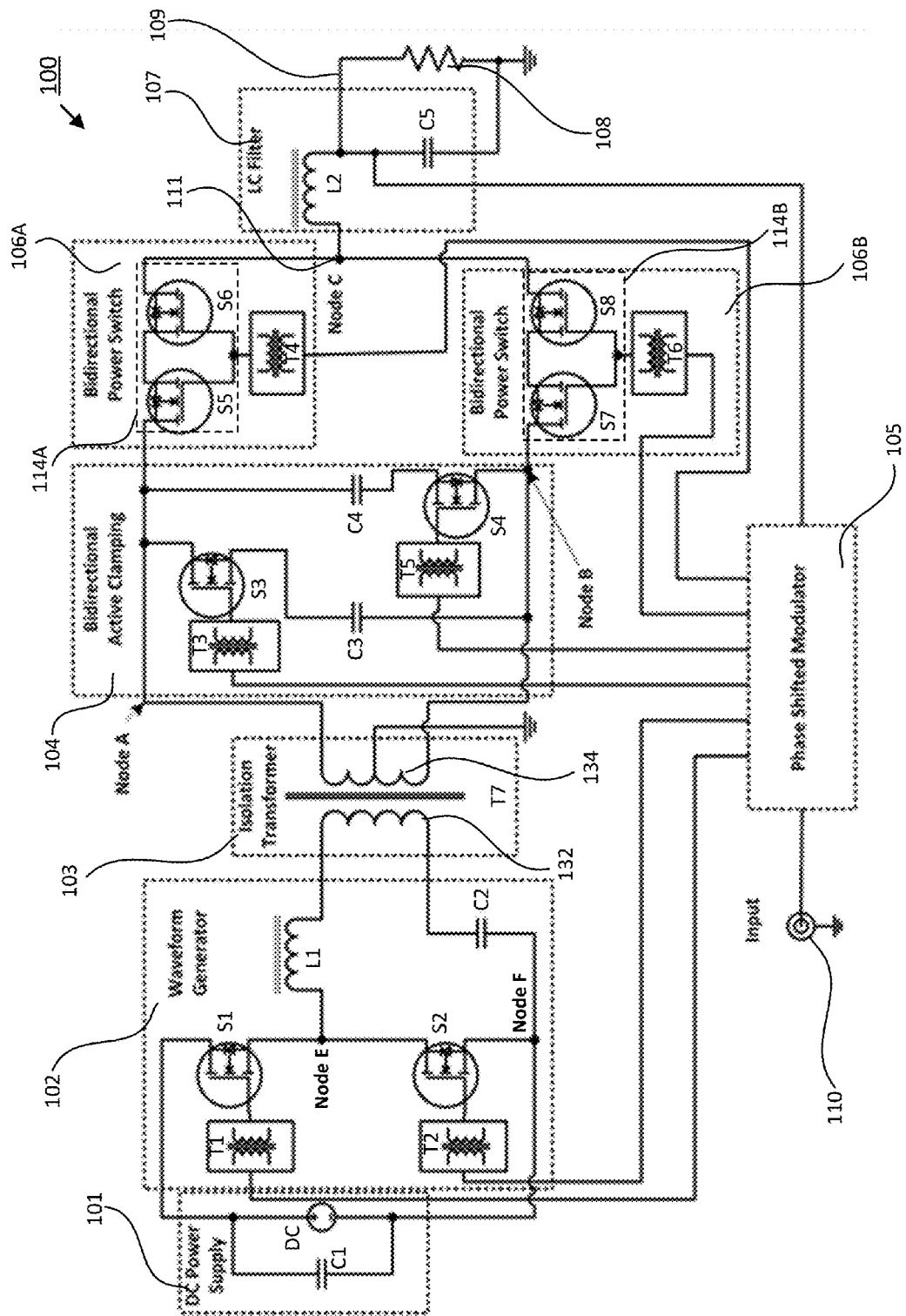
FIG. 7 is a simplified schematic of an example implementation of the disclosed single-stage switching power conversion apparatus 100, in accordance with one or more embodiments of the present disclosure.

FIG. 7 is a simplified schematic of an exemplary implementation of the disclosed single-stage switching power amplifier 100, in accordance with one or more embodiments of the present disclosure.

Isolation transformer circuit 103 may comprise an isolation transformer T7, which provides system electrical isolation. In one implementation, isolation transformer T7 has a single winding 132 on the primary side (which hereinafter will be simply referred to as "primary winding 132") and center-tapped windings on the secondary side (which, as a whole, will hereinafter be simply referred to as "secondary winding 134"). Hereinafter, the primary side of isolation transformer T7 will be simply referred to as "the primary side", and the secondary side of isolation transformer T7 will be simply referred to as "the secondary side". On the primary side, primary winding 132 is coupled to waveform generator circuit 102. On the secondary side, secondary winding 134 is coupled to bidirectional active clamping circuit 104.

As to the primary side, in one implementation, waveform generator circuit 102 is configured to generate 50% duty cycle symmetrical pulses of a fixed frequency as waveform signals at Nodes E and F to drive isolation transformer T7. The fixed frequency may normally be set at a value ranging from about 20 KHz to about 500 KHz.

As illustrated, waveform generator circuit 102 may use a half bridge configuration to generate waveform signals, with switching FETs S1 and S2 driven by drive signals S1 and S2 outputted by isolation driving transformers T1 and T2, respectively. Transformers T1 and T2 are driven by control (drive) signals T1 and T2 supplied from modulator circuit 105. The waveforms of drive signals T1 and S1 are substantially identical except for amplitude. Thus, for practical purposes, drive signals T1 and S1 may each be viewed interchangeably as a drive signal generated for driving FET (switch) S1. Similarly, drive signals T2 and S2 may each be viewed interchangeably as a drive signal generated for driving FET (switch) S2.

Switching FETs S1 and S2 may be implemented with MOSFETs, bipolar transistors, or any other kind of switching devices. In another implementation, waveform generator circuit 102 may use a configuration other than the illustrated half bridge configuration, such as a full bridge configuration, to generate waveform signals.

As illustrated, waveform generator circuit 102 may further comprise a resonant converter including an inductor L1 and a capacitor C2. Inductor L1 and capacitor C2 are of such respective inductance L1 and capacitance C2 that they function to create soft switching for switches S1 and S2 (with either ZCS or ZVS). The leakage inductance of isolation transformer T7 can be a part of the inductance L1 of the resonant network (converter). Compared to amplifier 20 or 30 of the conventional art, the disclosed switching amplifier 100, with the resonant converter, may have its waveform signals E and F operating in soft switching (with either ZCS or ZVS) to reduce switching losses, resulting in the system efficiency being further improved.

DC power supply circuit 101 on the primary side supplies power to waveform generator circuit 102. In addition to being a DC power source, DC power supply circuit 101 may further comprise capacitor C1 coupled across the DC power source. With this configuration, capacitor C1 may function as a filter capacitor, which acts like an energy storage tank, to store and recirculate return energy flowing back (from, e.g., the secondary side) via waveform generator circuit 102.

Turning to the secondary side, in one implementation, bidirectional active clamping circuit 104 comprises two switch-capacitor pairs (S3, C3) and (S4 and C4) coupled in parallel with each other across secondary winding 134. As to each switch-capacitor pair, its switch is connected in series with its capacitor, with its switch having one end connected to one terminal of the secondary winding and its capacitor having one end connected to the other end of the secondary winding. In one implementation, each of capacitors C3 and C4 has a capacitance of approximately 0.47 µf (microfarads).

Switches S3 and S4 are coupled to different terminals of secondary winding 134, with the upper end of switch S3 coupled to the upper terminal of the secondary winding (namely, Node A) and the lower end of switch S4 coupled to the lower terminal of the secondary winding (namely, Node B). In one implementation, switches S3 and S4 are implemented using MOSFETs each having its internal body diode. As illustrated, MOSFETs S3 and S4 are configured such that their respective inversely coupled body diodes are oppositely biased. In another implementation, switches S3 and S4 may be implemented using other type of switches each not having a body diode of its own. In such an implementation, for each of switches S3 and S4, a diode is added to be coupled across the upper and lower terminals of each switch accordingly so as to implement the configuration of the corresponding MOSFET (having its own body diode) illustrated in FIG. 7.

Switches S3 and S4 are driven by drive signals S3 and S4 outputted by isolation driving transformers T3 and T5, respectively. Transformers T3 and T5 are respectively driven by control (drive) signals T3 and T5 supplied from modulator circuit 105. For reasons same as those stated in connection with drive signals T1 and S1, for practical purposes, drive signals T3 and S3 may each be viewed interchangeably as a drive signal generated for driving MOSFET (switch) S3, while drive signals T5 and S4 may each be viewed interchangeably as a drive signal generated for driving MOSFET (switch) S4.

Figure 8A:
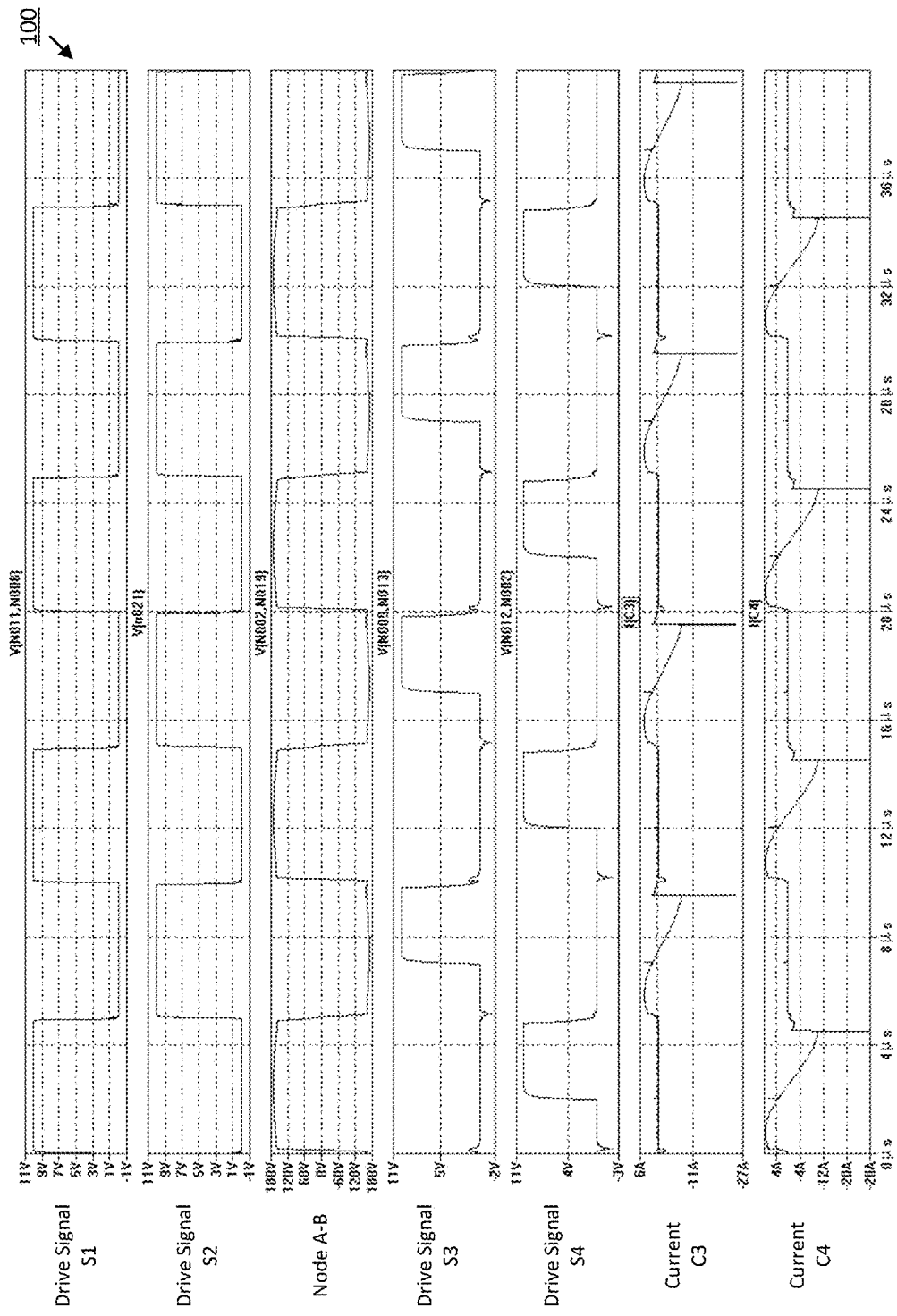
FIGS. 8A-B are pictorials illustrating exemplary waveforms of relevant signals provided or otherwise generated during the functioning of a bidirectional active clamping circuit of the disclosed single-stage switching power conversion apparatus 100, in accordance with one or more embodiments of the present disclosure.

FIG. 8A is a pictorial illustrating exemplary waveforms of drive signals S1, S2, S3 and S4, current signals flowing through C3 and C4, and the signal across Node A-B, in accordance with one or more embodiments of the present disclosure.

As illustrated, driving signals S1 and S2 are both 50% duty cycle square waves inverse with respect to each other. Since drive signals S1 and S2 drives FETs S1 and S2 to generate the waveform signals E and F used to drive primary winding 132, the waveforms of waveform signals E and F (not shown) track the waveforms of drive signals S1 and S2 (in terms of going "high" and going "low"), respectively, except for amplitude. Thus, the two generated waveform signals E and F are also 50% duty cycle square wave inverse with respect to each other. The common amplitude of waveform signals E and F is stepped up by the DC power source of power supply circuit 101. Through driving transformer T7, waveform signals E and F generate, on the secondary side, two corresponding amplified waveform signals A and B at Nodes A and B—which are the two terminals of secondary winding 134—respectively.

As shown in FIG. 8A, the waveform of the signal across Node A-B—which is a differential signal between amplified waveform signals A and B—substantially tracks the waveform of drive signal S11, except for amplitude. As shown, the amplitude of signal A-B is "stepped up" (amplified) from the amplitude of drive signal S1. This results from the stepping up of waveform signals E and F as well as the amplification function of transformer T7. As such, signal A-B (across Node A-B) is also an amplified waveform signal substantially tracking drive signal S1. In other words, amplified waveform signal A-B is also a 50% duty cycle square wave having the same frequency as that of drive signals S1 and T1 and waveform signals E and F.

Figure 4A:
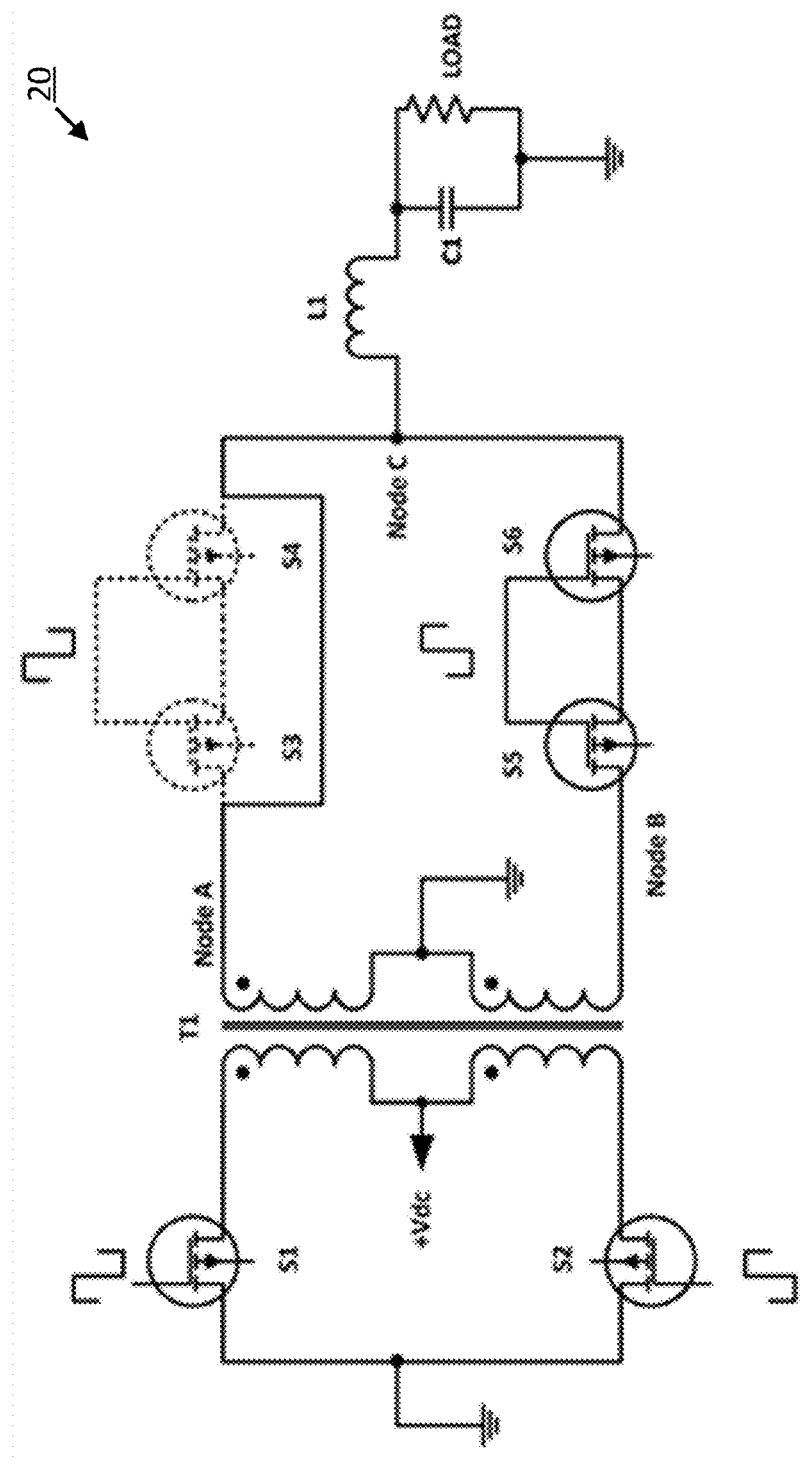
FIGS. 4A-D are schematics and a pictorial for illustrating one or more equivalent circuits of the conventional amplifier 20 during operations thereof, in accordance with the related art.
Figure 4B:
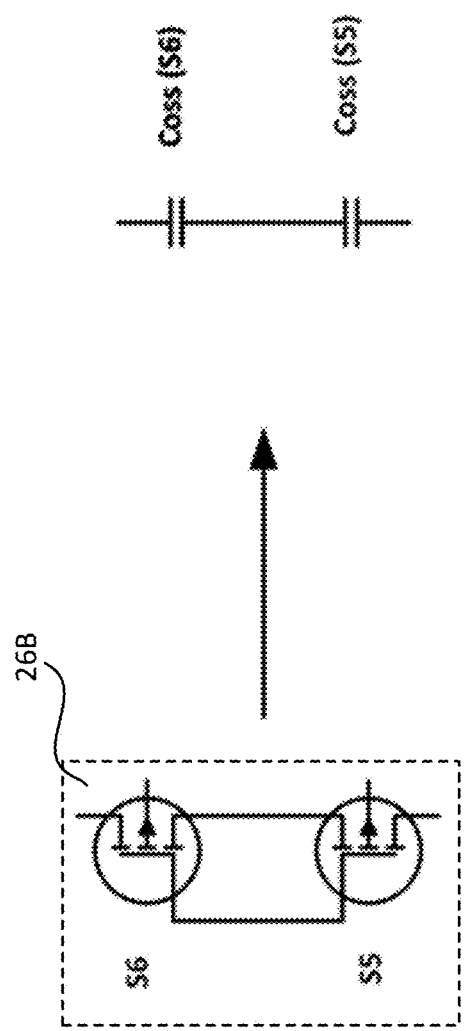
Figure 4C:
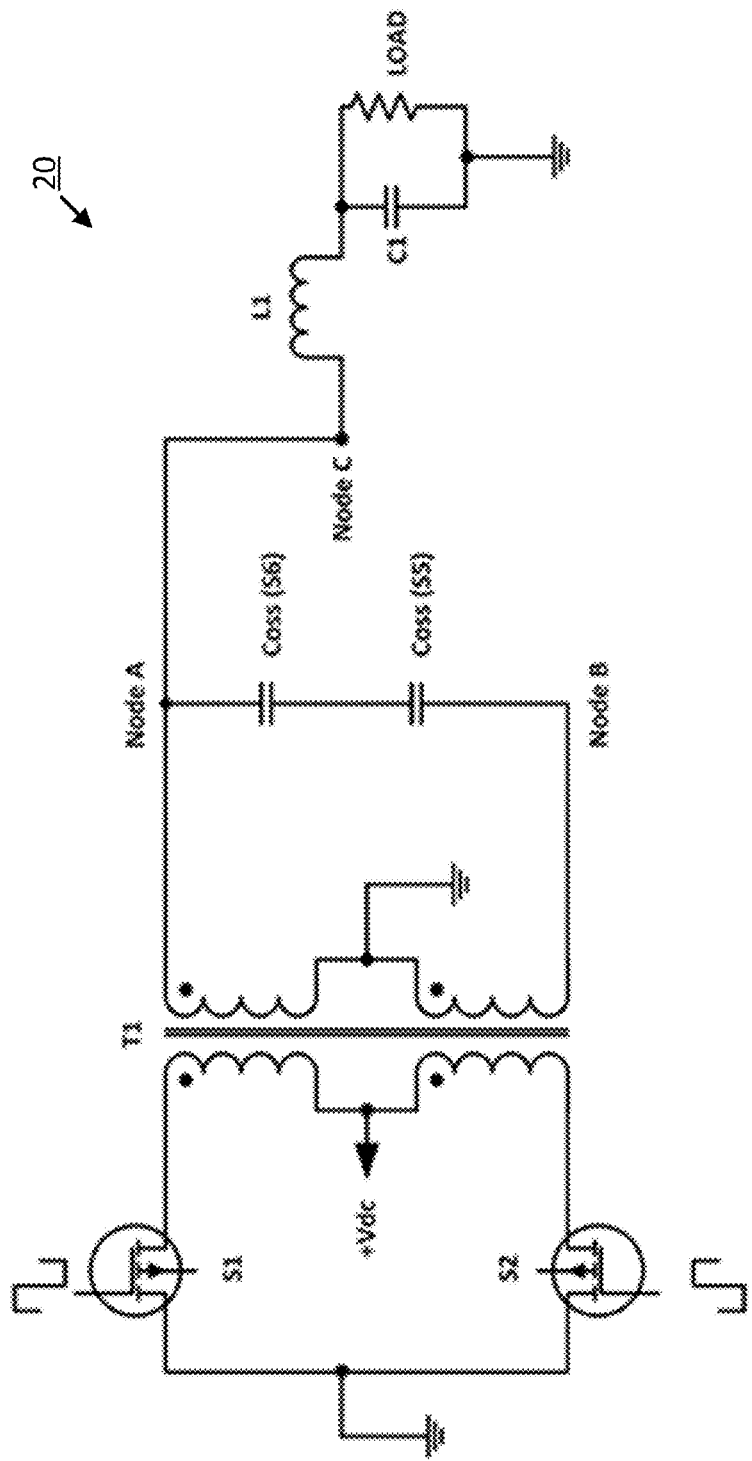
Figure 4D:
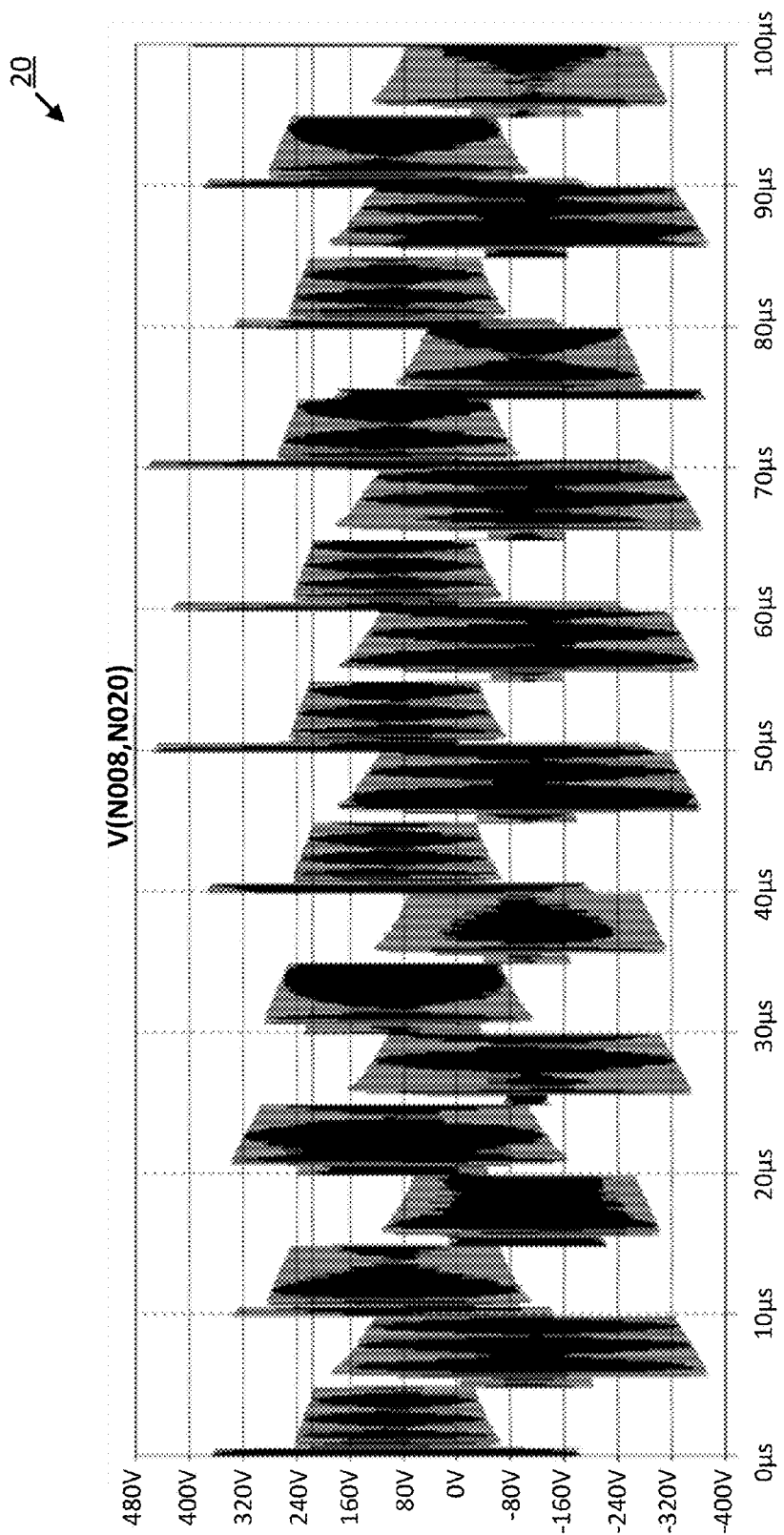
Figure 5A:
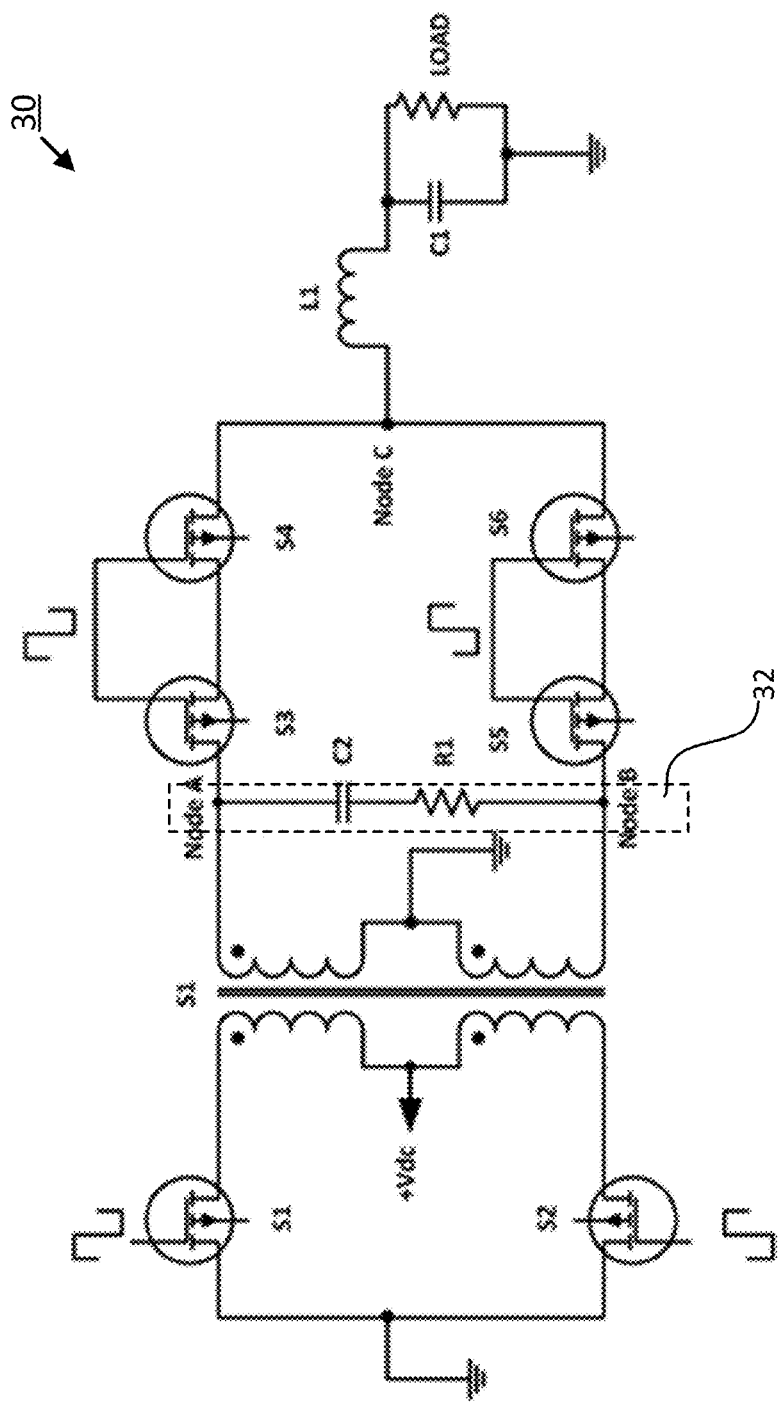
FIGS. 5A-B are a schematic and a pictorial for illustrating a conventional amplifier 30 altered from the conventional amplifier 20 in an attempt to address deficiencies of amplifier 20, in accordance with the related art.
Figure 5B:
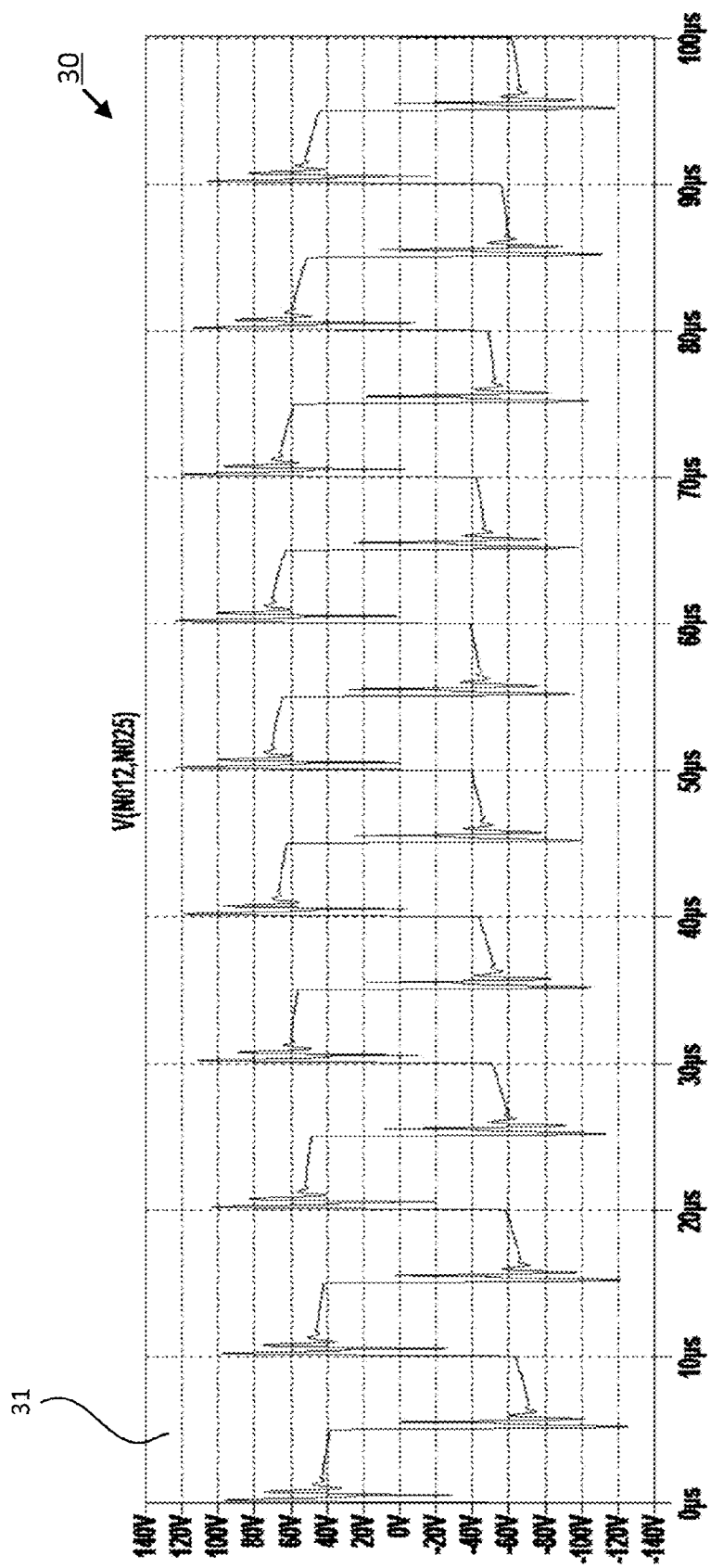

If there were no bidirectional active clamping circuit 104, amplified waveform signal A-B—namely, the amplified signal across Node A-B—would have included excess ringing and voltage spikes, as shown in FIG. 4D. With bidirectional active clamping circuit 104, amplified waveform signal A-B has a clean waveform without excess ringing and voltage spikes.

Referring to FIG. 8A, for each cycle of signal A-B, when signal A-B is in the positive half cycle (which indicates that the signal at Node A is positive relative to the signal at Node B), during the first half of the positive half cycle (or, in other words, the first quarter of the cycle), both drive signals S3 and S4 go low, resulting in both switches S3 and S4 being turned off and capacitor C4 being charged through the body diode (or coupled diode) of switch S4. As such, capacitor C4, much like an energy storage tank, absorbing and storing the energy associated with the ringing and spikes which otherwise would have been produced during this first half of the positive half cycle. During the second half of the positive half cycle (or, in other words, the second quarter of the cycle), drive signal S3 remains low but drive signal S4 goes high, resulting in switch S3 remaining turned off while switch S4 becoming turned on. With this configuration, due to the turning on of MOSFET S4, capacitor C4 is able to release (discharge) the energy previously stored during the first half of the positive half cycle back to isolation transformer T7 through secondary winding 134, resulting in the released energy either returning to the primary side through primary winding 132 or re-supplied to the secondary side (and then to load 108).

As appreciated by a skilled artisan, once the released energy returns to the primary side, because of the configurations of the primary side circuitries including waveform generator circuit 102 and DC power supply circuit 101, the return energy is in effect reclaimed by the primary side circuitries, and may then be stored and recirculated for useful (productive) purposes (such as the power amplification purpose or the soft-switching purpose) by the primary side circuitries. As an example, as the return energy flows backs to the primary side through switches S1 and S2 in the form of a return current, the return current may combine with the switching current (which, in the implementation illustrated in FIG. 8A, has a waveform of square wave), forming a net current waveform or net voltage waveform contributing to zero current switching (ZCS) or zero voltage switching (ZVS) for switches S1 and S2, a condition which results in the system efficiency being greatly improved.

Similarly, when signal A-B is in the negative half cycle of each cycle, switches S3 and S4 are controlled in a manner similar to the manner in which they are controlled when signal A-B is in the positive half cycle of each cycle. Specifically, during the first half of the negative half cycle (or, in other words, the third quarter of the cycle), both drive signals S3 and S4 go low, resulting in both switches S3 and S4 being turned off and capacitor C3 being charged through the body diode (or coupled diode) of switch S3. As such, capacitor C3, much like an energy storage tank, absorbs the energy associated with the ringing and spikes (which otherwise would have been generated during this first half of the negative half cycle) by storing the energy. During the second half of the negative half cycle (or, in other words, the fourth quarter of the cycle), drive signal S4 remains low while drive signal S3 goes high, resulting in switch S4 remaining turned off while MOSFET S3 becoming turned on. With this configuration, due to the turning on of switch S3, capacitor C3 is able to release (discharge) the energy previously stored during the first half of the negative half cycle back to isolation transformer T7 through secondary winding 134. This discharging (releasing) of the stored energy results in the released energy returning to the primary side through primary winding 132 or being re-supplied to the secondary side (and then to the load). As such, the return energy may be reclaimed, recirculated, or otherwise re-used by the primary side circuitries or the secondary circuitries for productive purposes such as those described above in connection with how the bidirectional active clamping circuit 104 operates during the positive half cycle of each cycle.

Figure 8B:
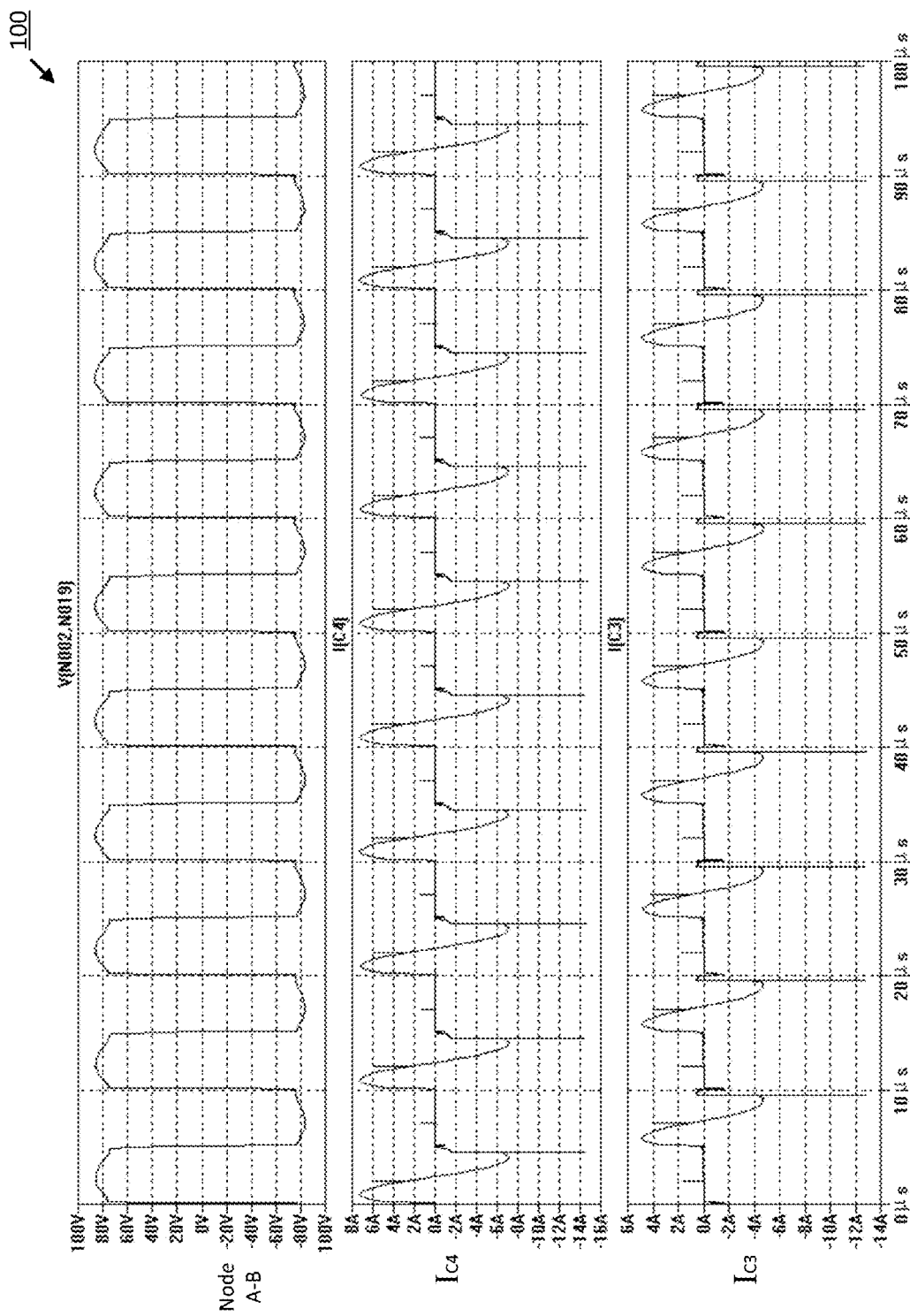

Exemplary waveforms of the current signals of C4 and C3, as illustrated in FIG. 8A, show the respective timings in connection with charging and discharging of C4 and C3 during each cycle of signal A-B. Referring to FIG. 8B, which is a pictorial illustrating amplified waveforms of current signals of C4 and C3 as well as an amplified waveform of amplified signal A-B, signal A-B has a clean waveform without noticeable ringing and voltage spikes while substantially maintaining the intended square wave waveform which are needed for generating amplified modulated signals by bidirectional power switch circuit 106. Thus, with the bidirectional active clamping circuit 104, in one hand, disruptive ringing and voltage spikes which otherwise would have occurred are eliminated or otherwise maximally reduced, and in another hand, the energy associated with the otherwise occurring ringing and voltage spikes are reclaimed for productive purposes (which results in further improving the system efficiency), rather than are dissipated on snubber resistors (as is the case for amplifier 30 of the conventional art).

As a skilled artisan readily appreciates, the waveforms of drive (control) signals S3 and S4 illustrated in FIG. 8A is merely exemplary. There can be various other waveforms of drive signals S3 and S4 which can be used to achieve the same energy absorbing (storing) and discharging functions achieved by the illustrated waveforms of drive signals S3 and S4. In particular, during the positive half cycle of each cycle of signal A-B, drive signal S3 must go low so as to turn off switch S3, while drive signal S4 may be of various waveforms so long as the waveform includes one or more time intervals configured to enable capacitor C4 to absorb (store) enough energy to eliminate (or maximally reduce) otherwise occurring ringing and spikes through charging capacitor C4 with switch S4 being turned off, while also give ample opportunities to capacitor C4 for capacitor C4 to release the previously stored energy through discharging with switch S4 being turned on.

Similarly, during the negative half cycle of each cycle of signal A-B, drive signal S4 must go low so as to turn off switch S4, while drive signal S3 may be of various waveforms so long as the waveform includes one or more time intervals configured to enable capacitor C3 to absorb (store) enough energy to eliminate otherwise occurring ringing and spikes through charging capacitor C3 with switch S3 turned off, while also give ample opportunities to capacitor C3 for capacitor C3 to release the previously stored energy through discharging with switch S3 being turned on.

Returning to FIG. 7, bidirectional power switch circuit 106 comprises bidirectional power switch sub-circuits 106A and 106B each comprising a bidirectional power switch and an isolation driving transformer outputting a drive signal driving the bidirectional power switch. The bidirectional power switch of each sub-circuit may be configured using two switching devices in a manner similar to the manner in which bidirectional power switches 26A or 26B are configured using two MOSFETs, as illustrated and described in the incorporated '175 patent. In another implementation, the bidirectional power switch of each sub-circuit may be configured using one or more switching devices of other types so long as the bidirectional power switch, as a whole, functions as a high-frequency switch and conducts in both directions. Thus, sub-circuit 106A comprises bidirectional power switch 114A configured using a pair of switching devices S5 and S6 as well as isolation driving transformer T4, and likewise, sub-circuit 106B comprises bidirectional power switch 114B configured using a pair of switching devices S7 and S8 as well as isolation driving transformer T6.

As to each bidirectional power switch sub-circuit, one end of its bidirectional power switch is coupled to bidirectional active clamping circuit 104 via one terminal of secondary winding 134 so as to receive an amplified waveform signal, and the other end of its bidirectional power switch is coupled to filter circuit 107 via an output Node C common to both bidirectional power switch sub-circuits. For reasons same as those stated in connection with drive signals T1 and S1, for practical purposes, the drive signal driving the isolation driving transformer and the drive signal outputted by the isolation driving transformer to drive the bidirectional power switch may each be viewed interchangeably as a drive signal generated for driving the bidirectional power switch. In particular, the drive signal driving the isolation driving transformer is carrier signal (modulated with input signal 110) supplied from modulator circuit 105.

Thus, for bidirectional power switch sub-circuits 106A and 106B, bidirectional power switch 114A and 114B are coupled to bidirectional active clamping circuit 104 via Nodes A and B so as to receive amplified waveform signals A and B, respectively, and are coupled to filter circuit 107 via common output Node C. Drive signals T4 and 114A may each be viewed interchangeably as a drive signal generated for driving bidirectional power switch 114A, and drive signals T6 and 114B may be viewed interchangeably as a drive signal generated for driving bidirectional power switch 114B. Drive signals T4 and T6 are carrier signals (modulated with input signal 110) supplied from modulator circuit 105. Thus, drive signals 114A and 114B are likewise carrier signals modulated with input signal 110.

Figure 9A:
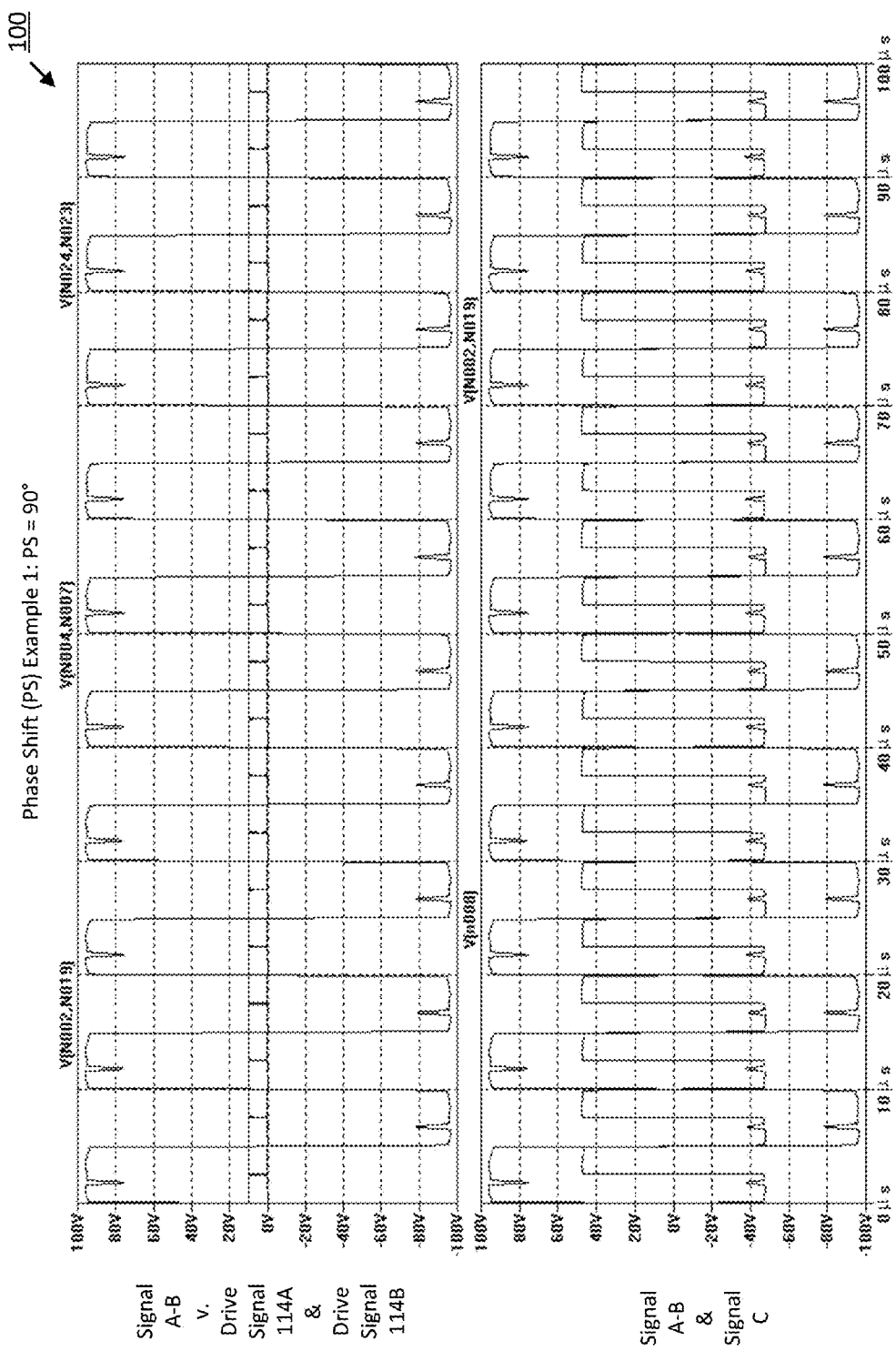
FIGS. 9A-B are pictorials illustrating exemplary waveforms of relevant signals provided or otherwise generated for driving a pair of bidirectional power switches so as to produce an amplified modulated signal, in accordance with one or more embodiments of the present disclosure.
Figure 9B:
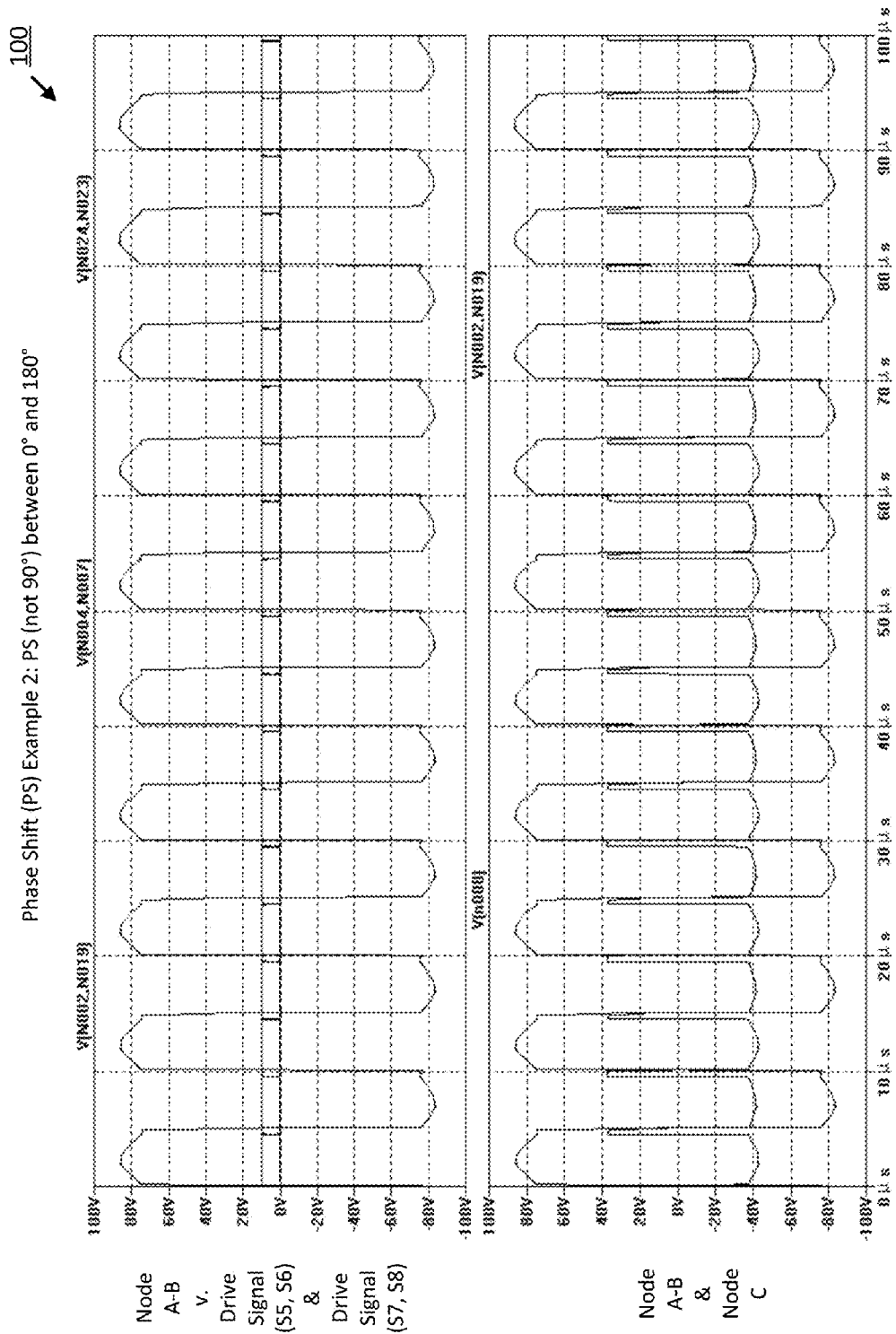

FIGS. 9A-B are pictorials illustrating exemplary waveforms of relevant signals provided or otherwise generated for driving and controlling a pair of bidirectional power switches so as to produce an amplified modulated signal, in accordance with one or more embodiments of the present disclosure.

In one implementation, the waveform of amplified waveform signal A-B is roughly a high-frequency 50% duty cycle square wave. Drive signals 114A and 114B (respectively driving bidirectional power switches 114A and 114B) are phase-shifted-modulated signals each phase-shifted with respect to signal A-B representing a signal level of input signal 110. Drive signals 114A and 114B are inverse with respect to each other, and thus differ in phase by 180°, as illustrated in both FIGS. 9A and 9B.

FIG. 9A is directed to a first scenario where drive signal 114A is phase-shifted by 90° with respect to signal A-B and drive signal 114B is phase-shifted by 270° with respect to signal A-B. In this first scenario, as illustrated, an amplified modulated signal C (which is another name of signal 111) is produced at output Node C, with amplified modulated signal C being an equal duty cycle pulse signal having the switch frequency twice that of signal A-B and the amplitude half of that of signal A-B. Amplified modulated signal C is converted to a zero output voltage 109 across load 108 by filter circuit 107 (comprising a pair of inductor L2 and capacitor C5).

FIG. 9B is directed to a second scenario where drive signal 114A is phase-shifted by a non-90° phase between 0° and 180°. In an example of this second scenario, as illustrated in FIG. 9B, drive signal 114A is phase-shifted by a phase (e.g., 179°) close to 180° and drive signal 114B is phase-shifted by the corresponding phase close to 360°, both with respect to signal A-B. In this example, as illustrated, amplified modulated signal C is produced at output Node C, with the amplified modulated signal C having narrow pulses, and having the switch frequency twice that of signal A-B and the amplitude half of that of signal A-B. Amplified modulated signal C in turn is converted to a minimum negative output amplified voltage (or, in other words, negative output voltage of maximum absolute value) of amplified output signal 109 across load 108.

Similarly, in another example of the second scenario where drive signal 114A is phase-shifted by a phase (e.g. 1°) close to 0° and drive signal 114B is phase-shifted by the corresponding phase close to 180°, amplified modulated signal C (not shown) is produced at output Node C, with the amplified modulated signal C having wide pulses, and having the switch frequency twice that of signal A-B and the amplitude half of that of signal A-B. Amplified modulated signal C in turn is converted to a maximum positive output amplified voltage of amplified output signal 109 across load 108.

Thus, as a skilled artisan appreciates, as the phase shift of carrier signal 114A moves downward from, e.g., 179° to 1°, the output voltage of amplified output signal 109 moves upward from, e.g., the minimum negative voltage (or, in other words, negative voltage of maximum absolute value) to the maximum positive voltage.

In the exemplary implementation of bidirectional power switch sub-circuits 106A and 106B illustrated in FIG. 7, each sub-circuit has one bidirectional power switch (driven by a corresponding driving transformer) and both sub-circuits share a common output node (namely, Node C). In an alternate implementation, depending on the configurations of other component modules of the disclosed amplifier 100, each sub-circuit may instead have a pair of bidirectional power switches (each driven by a corresponding driving transformer), and have its own separate output node from the other sub-circuit. Thus, in this alternate implementation, bidirectional power switch circuit 106 comprises two pairs of bidirectional power switches (for a total of four bidirectional power switches), rather than one pair of bidirectional power switches (as is the case for the implementation shown in FIG. 7).

Moreover, in this alternate implementation, since each sub-circuit outputs a separate amplified modulated at its own separate output node, bidirectional power switch circuit 106 may produce an amplified modulated differential signal across the two respective output nodes of the two sub-circuits, with the amplified modulated differential signal being used by filter circuit 107 to generate amplified output signal 109 across load 108. Alternatively, bidirectional power switch circuit 106 may simply output two output nodes each from one of its two sub-circuits 106A and 106B, with the two output nodes serving as two input nodes of filter circuit 107 for producing amplified output signal 109 across load 108.

Returning to FIG. 7, FIG. 7 shows an exemplary implementation of filter circuit 107 which comprises a pair of inductor L2 and C5 forming a conventional LC filter used to filter out the carrier frequency of amplified modulated signal C, so as to demodulate amplified modulated signal C (signal 111) to generate amplified output signal 109 (which is a substantially amplified replica of input signal 110). The LC filter is configured to filter out the carrier frequency of amplified modulated signal C, which twice the frequency of signal A-B. The corner frequency is set above the cut-off frequency of the upper band. For instance, if the disclosed amplifier 100 operates at a range of from about 20 Hz to about 20 KHz, a 30 KHz corner frequency may be chosen for filter circuit 107.

In an alternative implementation, depending on the configurations of other component modules of the disclosed amplifier 100, filter circuit 107 may instead comprise two inductor-capacitor pairs—rather than one inductor-capacitor pair, as is the case for the implementation shown in FIG. 7—outputting two respective signal across load 108, thus forming a differential amplified output signal 109 that is a substantially amplified replica of input signal 110.

Filter circuit 107 may be implemented using a scheme other than a conventional LC filter so long as filter circuit 107 is able to demodulate an input amplified modulated signal (such as signal C) to generate amplified output signal 109 that is a substantially amplified replica of input signal 110.

Figure 10:
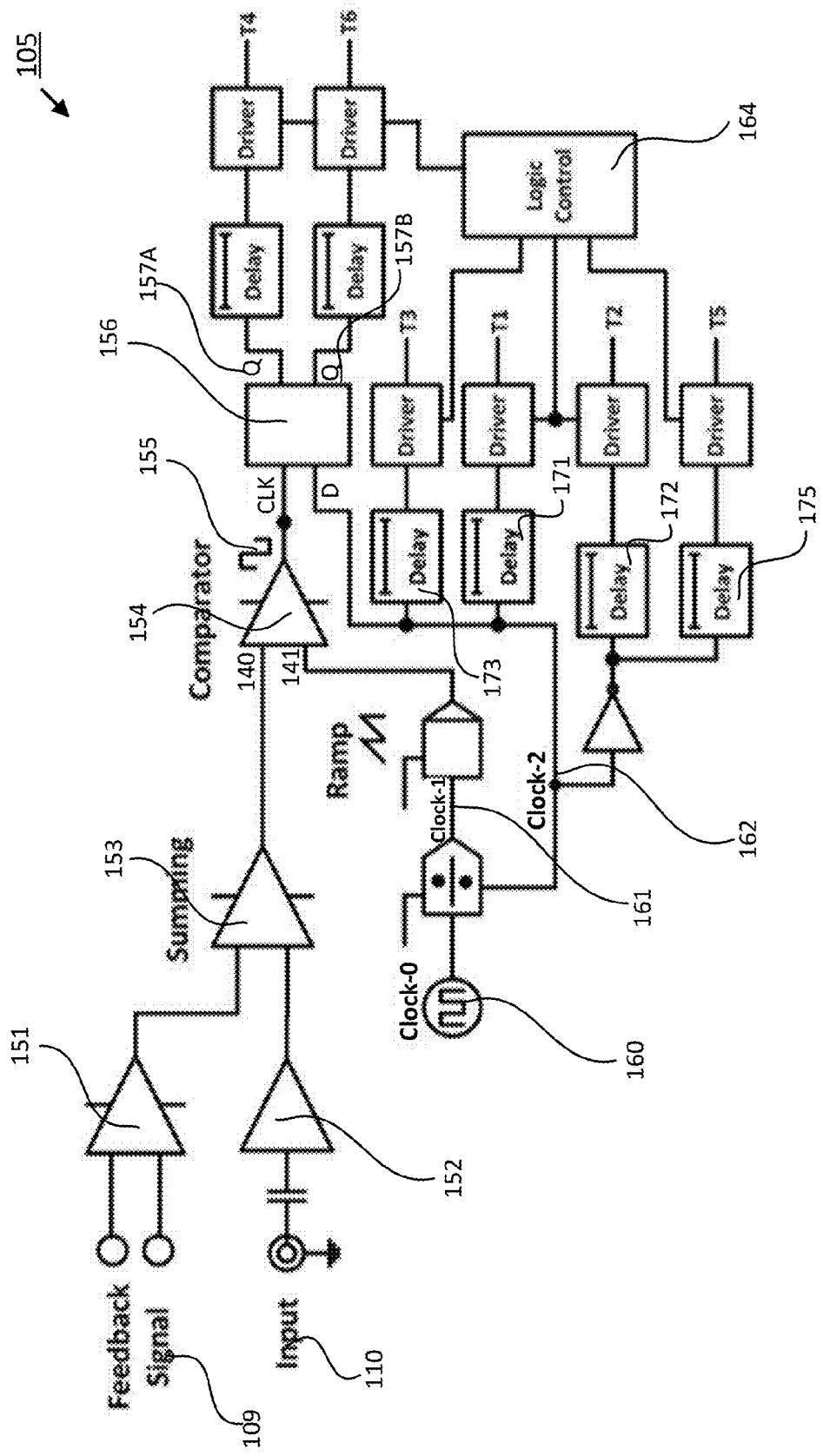
FIG. 10 is a simplified schematic circuit diagram illustrating an exemplary implementation of a phase-shifted modulator circuit of the disclosed single-stage switching power conversion apparatus 100, according to one or more embodiments of the present disclosure.

FIG. 10 is a simplified schematic circuit diagram illustrating an exemplary implementation of modulator circuit 105 of the disclosed single-stage switching power conversion apparatus 100, according to one or more embodiments of the present disclosure.

Referring to FIG. 10, modulator circuit 105 receives input signal 110 as an input signal for modulation. Modulator circuit 105 may receive output signal 109 generated across load 108 as feedback signal 109. As well-known, with two sensing amplifiers 152 and 151 respectively applied to input signal 110 and feedback signal 109, and with two respective output signals of sensing amplifiers 152 and 151 fed into summing amplifier 153, error correction may be achieved with the output signal of summing amplifier 153, which is an error-corrected version of input signal 110 (hereinafter referred to as "error-corrected input signal 140").

Comparator 154 receives error-corrected input signal 140 as its first input and a tooth wave ramp signal 141 as a second input, and outputs signal 155, which is pulse-width modulated (PWM) with input signal 110. Thus, signal 155 hereinafter will be referred to as PWM signal 155. The tooth wave ramp signal 141 is generated by a ramp generator receiving a clock-1 signal 161 as its CLOCK signal using known techniques. Clock-1 signal 161 is produced by a frequency divider driven by a much faster clock-0 signal 160, whose frequency is normally set in the order of Mhz. The frequency of clock-1 signal 160 is usually a fraction of that of clock-0 signal 160 depending on the division performed by the frequency divider on clock-0 signal 160. In one implementation, the frequency clock-1 signal 160 may be in the range between 100 khz and 1 Mhz.

PWM signal 155 is fed into a rising edge triggered D flip-flop 156 as its CLK input, while another clock-2 signal 162 is fed into D flip-flop 504 as its D input. Similar to clock-1 signal 161, clock-2 signal 162 may also be produced by the frequency divider, with clock-2 signal 162 being further divided by the frequency divider and having a frequency one half of the frequency of clock-1 signal 161. D flip-flop 156, at its "Q" output and its "Q inverse" output, produces inverse pulse train signals 157A and 157B, respectively, with pulse train signal 157A having equal 50% duty cycles and phase-shifted with respect to clock-2 signal 162 (which functions as a reference signal). In particular, each unequal phase shift of pulse train signal 157A corresponds to an unequal pulse width in PWM signal 155. Thus, pulse train signal 157A is a phase shifted modulated (PSM) signal with its fundamental frequency being the frequency of clock-2 signal 162. As such, pulse train signal 157A may hereinafter be referred to as "PSM signal 157A."

Therefore, PSM signal 157A is phase shift modulated with input signal 110, with each unequal phase shift therein corresponding to an unequal duty cycle in PWM signal 155 (which, as noted, is used to represent an analog signal level of input signal 110). Thus, PSM signal 157A is a carrier signal carrying information representing input signal 110. Hence, PSM signal 157A hereinafter will also be referred to as "PSM carrier signal 157A" or "carrier PSM signal 157A." Since pulse train signal 157B is inverse from pulse train signal 157A, pulse train signal 157B is also a PSM carrier signal carrying information representing input signal 110, and therefore will hereinafter similarly be referred to as "PSM carrier signal 157B" or "carrier PSM signal 157B." PSM carrier signals 157A and 157B are then respectively used to generate duplicate inverse carrier drive signals T4 and T6 (which are respectively used to drive bi-directional switches 114A and 114B through transformers T4 and T6) using known illustrated configurations including known delay, driver and logic control circuits, resulting in carrier drive signals T4 and T6 being PSM signals with their fundamental frequency set to the frequency of clock-2 signal 162.

Clock-2 signal 162 is additionally used to generate inverse drive signals T1 and T2 (which are respectively used to drive FETs S1 and S2 of wave generator circuit 102 through transformers T1 and T2) as a base signal using known illustrated configurations including known inverter, delay, driver and logic control circuits. These known configurations result in the switching frequency of drive signals T1 and T2 being set to the frequency of clock-2 signal 162, and carrier driver signals T4 and T6 (which, as noted above, have their fundamental frequency set to the frequency of clock-2 signal 162) being PSM signals with respect to drive signals T1 and T2.

Clock-2 signal 162 is further used to generate control (drive) signals T3 and T5 (which are respectively used to control "ON" and "OFF" of MOSFETs S3 and S4 through transformers T3 and T5) as a base signal based on pre-determined (fix) waveforms of control signals T3 and T5 in relation to waveforms of drive signals T1 and T2 (whose waveforms, as noted or illustrated above, are either substantially tracked by (identical to) the waveform of Node A-B or substantially inverse from the waveform of Node A-B, except for amplitude), respectively.

As illustrated in FIG. 8A, for each cycle of both drive signals S3 and S1, drive (control) signal S3 has a pre-determined timing relationship in relation to drive signal S1 in terms of turning "ON" (going high) and turning "OFF" (going low). Also, the waveform of control signal T3 tracks the waveform of control signal S3 (except for amplitude), and the waveform of drive signal T1 tracks the waveform drive signal S1 (except for amplitude). Thus, for each cycle of drive signals T3 and T1, drive (control) signal T3 also has a pre-determined (fixed) timing relationship in relation to drive signal T1 in terms of turning "ON" (going high) and turning "OFF" (going low). This pre-determined timing relationship between drive signals T3 and T1 can be seen in the very example shown in FIG. 8A. Specifically, for each period, the ON-time of drive signal T3 is delayed by roughly three quarters of a period in relation to the ON-time of drive signal T1 while the OFF-time of drive signal T3 is roughly identical to (or may even be slightly earlier than, when other known factors are considered) the OFF-time of drive signal T1, resulting in drive signal T3 having a roughly 25% duty cycle in relation to drive signal T1 having a 50% duty cycle.

Knowing this pre-determined timing relationship between drive signals T3 and T1, after clock-2 signal 162 is received by delay circuit 173, for each cycle of clock-2 signal 162, logic control circuit 164 (which, among other things, sets proper timing and dead times) manages to have delay circuit 173 create (for drive signal T3) a pre-determined (fixed) ON-time and OFF-time in relation to the known different ON-time and OFF-time which delay circuit 171 creates (for drive signal T1), such that the output signal of delay circuit 173 (used for generating drive signal T3) implements this pre-determined (fixed) timing relationship in relation to the corresponding output signal of delay circuit 171 (used for generating drive signal T1). Known driver circuitry is then employed to drive the output signal of delay circuit 173 to produce drive (control) signal T3.

Similarly, for each cycle of drive signals T5 and T2, T5 also has a pre-determined (fixed) timing relationship in relation to drive signal T2 in terms of turning ON (going high) and turning OFF (going low). Thus, the same scheme which is practiced to generate drive signal T3 based on drive signal T1 is also practiced to generate drive signal T5 based on drive signal T2, through corresponding timing control of logic control circuit 164 performed on delay circuit 175 (used for generating drive signal T5) and delay circuit 172 (used for generating drive signal T2), and using clock-2 signal 162 as a base signal.

In the illustrated exemplary implementation of modulator circuit 105, phase-shift modulation is used for modulating an input signal. A skilled artisan readily appreciates another modulation scheme other than phase-shift modulation may be used to generate applicable carrier signals (such as carrier signals T4 and T6), drive signals (such as drive signals T1 and T2) and control signals (such as control signals T3 and T5) or their equivalents using circuitries modified or otherwise adapted based on the used modulation scheme without departing the spirit and the scope of the present disclosure.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims.

What is claimed is:

1. A switching power amplifier for receiving an input signal and generating an amplified output signal across a load, the amplifier comprising:

a transformer unit comprising one transformer having a primary winding and a secondary winding;

a modulator unit configured to receive an input signal, the modulator unit configured to modulate the received input signal in generating and supplying a set of one or more carrier control signals carrying the information about the input signal, the modulator unit configured to generate and supply a set of one or more waveform drive signals, the set of one or more waveform drive signals including at least one periodic waveform drive signal having a pre-set period, the modulator unit configured to generate and supply a set of one or more clamping drive signals including at least one clamping drive signal derived from the at least one periodic waveform drive signal with respect to a timing relationship there-between;

a primary side unit coupled to the modulator unit and coupled to the primary winding of transformer unit, the primary side unit configured to supply power, the primary side unit configured to generate a set of one or more waveform signals using the set of one or more waveform drive signals supplied from the modulator unit, the set of one or more waveform signals driving the primary winding of the transformer unit; and a secondary side unit coupled to the modulator unit, the secondary side unit coupled to the secondary winding of the transformer unit, the secondary side unit configured to generate a set of one or more amplified periodic waveform signals respectively at a corresponding set of one or more terminals of the secondary winding upon the set of one or more waveform signals driving the primary winding of the transformer unit, the secondary side unit configured to perform, during each time interval of a series of time intervals derived from a corresponding series of cycles of the at least one periodic waveform drive signal, an active clamping operation with respect to the set of one or more amplified periodic waveform signals, the active clamping operation performed using the set of one or more clamping drive signals supplied from the modulator unit, the active clamp operation causing the secondary side unit to absorb excess energy associated with ringing and voltage spikes otherwise included in the set of one or more amplified periodic waveform signals and discharge the absorbed excess energy so that the ringing and voltage spikes are largely absent in the set of one or more amplified periodic waveform signals, at least one portion of the discharged energy returning back to the primary side unit through the transformer unit, the secondary side unit configured to generate an amplified output signal across a load using the set of one or more amplified periodic waveform signals and the set of one or more carrier control signals received from the modulator unit, the amplified output signal being an amplified replica of the input signal.

2. The switching power amplifier of claim 1, wherein the secondary side unit is configured to perform, during each time interval of the series of time intervals each being one or multiple cycles of the at least one periodic waveform drive signal, the active clamping operation, the set of one or more clamping drive signals including the at least one clamping drive signal having a respective timing relationship to the at least one periodic waveform drive signal during each time interval of the series of time intervals.

3. The switching power amplifier of claim 2, wherein the secondary side unit is configured to perform, during each cycle of the at least one periodic waveform drive signal, the active clamping operation, the set of one or more clamping drive signals including the at least one clamping drive signal having a respective timing relationship to the at least one periodic waveform drive signal during each cycle of the at least one periodic waveform drive signal.

4. The switching power amplifier of claim 3, the secondary side unit is configured to perform, during at least one of the two half-cycles of each cycle of the at least one periodic waveform drive signal, the active clamping operation, the set of one or more clamping drive signals including the at least one clamping drive signal having a respective timing relationship to the at least one periodic waveform drive signal during at least one of the two half-cycles of each cycle of the at least one periodic waveform drive signal.

5. The switching power amplifier of claim 1, wherein the active clamping operation performed in a bidirectional manner such that currents of opposite directions are used respectively to absorb the excess energy and discharge the absorbed energy.

6. The switching power amplifier of claim 5, wherein the secondary side unit comprises an active clamping circuitry configured to perform the active clamping operation with respect to the set of one or more amplified periodic waveform signals, the active clamping circuitry comprising a set of one or more clamping sub-circuits each comprising a respective switch and a respective capacitor coupled in series with one another, with the respective switch having an inversely biased body diode and controlled by one clamping drive signal of the set of one or more clamping drive signals.

7. The switching power amplifier of claim 1, wherein the primary side unit comprises a half bridge configuration configured to generate the set of one or more waveform signals using the set of one or more waveform drive signals.

8. The switching power amplifier of claim 1, wherein the modulator unit uses phase-shift modulation to modulate the received input signal in generating and supplying the set of one or more carrier control signals.

9. The switching power amplifier of claim 1, wherein the secondary side unit comprises a switching circuit configured to generate one set of one or more amplified carrier signals carrying the information about the input signal, the switching circuit controlled by the set of one or more carrier control signals supplied from the modulator unit and amplified through the set of one or more amplified periodic waveform signals in generating the set of one or more amplified carrier signals, the secondary side unit configured to convert the set of one or more amplified carrier signals to the amplified output signal across the load.

10. The switching power amplifier of claim 9, wherein the secondary side unit configured to convert the set of one or more amplified carrier signals to the amplified output signal across the load using at least one LC filter.

11. The switching power amplifier of claim 1, wherein the amplified output signal across the load is a differential output signal across the load.

12. The switching power amplifier of claim 9, wherein the switching circuit comprises one set of one or more bidirectional power switches controlled by the set of one or more carrier control signals supplied from the modulator unit and receiving the set of one or more amplified periodic waveform signals in generating the set of one or more amplified carrier signals.

13. The switching power amplifier of claim 1, wherein the set of one or more waveform drive signals comprises at least two waveform drive signals, the set of one or more amplified periodic waveform signals comprises at least two amplified periodic waveform signals, the set of one or more carrier control signals comprises at least two carrier control signals, and the set of one or more clamping drive signals comprises at least two clamping drive signals.

14. The switching power amplifier of claim 9, wherein the set of one or more amplified carrier signals comprises at least two amplified carrier signals.

* * * * *